United States Patent
Okuyama et al.

(10) Patent No.: US 7,002,182 B2
(45) Date of Patent: Feb. 21, 2006

(54) SEMICONDUCTOR LIGHT EMITTING DEVICE INTEGRAL TYPE SEMICONDUCTOR LIGHT EMITTING UNIT IMAGE DISPLAY UNIT AND ILLUMINATING UNIT

(75) Inventors: Hiroyuki Okuyama, Kanagawa (JP); Goshi Biwa, Kanagawa (JP); Jun Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 136 days.

(21) Appl. No.: 10/657,467

(22) Filed: Sep. 8, 2003

(65) Prior Publication Data

US 2004/0129929 A1    Jul. 8, 2004

(30) Foreign Application Priority Data

Sep. 6, 2002    (JP)    ............................ P2002-261407

(51) Int. Cl.
*H01L 33/00*    (2006.01)
(52) U.S. Cl. ............................ 257/91; 257/79; 257/88; 257/98; 257/99; 257/103
(58) Field of Classification Search ........... 257/79–103
See application file for complete search history.

(56) References Cited

U.S. PATENT DOCUMENTS

| 6,881,982 B1 * | 4/2005 | Okuyama et al. ............. 257/91 |
| 2002/0074561 A1 * | 6/2002 | Sawaki et al. ............. 257/103 |
| 2003/0087467 A1 * | 5/2003 | Oohata et al. ............. 438/47 |

FOREIGN PATENT DOCUMENTS

WO    WO 02/07231    1/2004

* cited by examiner

*Primary Examiner*—Mary Wilczewski
*Assistant Examiner*—Monica Lewis
(74) *Attorney, Agent, or Firm*—Bell, Boyd & Lloyd LLC

(57) ABSTRACT

A semiconductor light emitting device with improved luminous efficiency is provided. An underlying n-type GaN layer is grown on a sapphire substrate, and a growth mask made from $SiO_2$ film or the like is formed on the underlying n-type GaN layer. An n-type GaN layer having a hexagonal pyramid shape is selectively grown on a portion, exposed from an opening of the growth mask, of the underlying n-type GaN layer. The growth mask is removed by etching, and then an active layer and a p-type GaN layer are sequentially grown on the entire substrate so as to cover the hexagonal pyramid shaped n-type GaN layer, to form a light emitting device. An n-side electrode and a p-side electrode are then formed.

10 Claims, 26 Drawing Sheets

F I G. 4 A
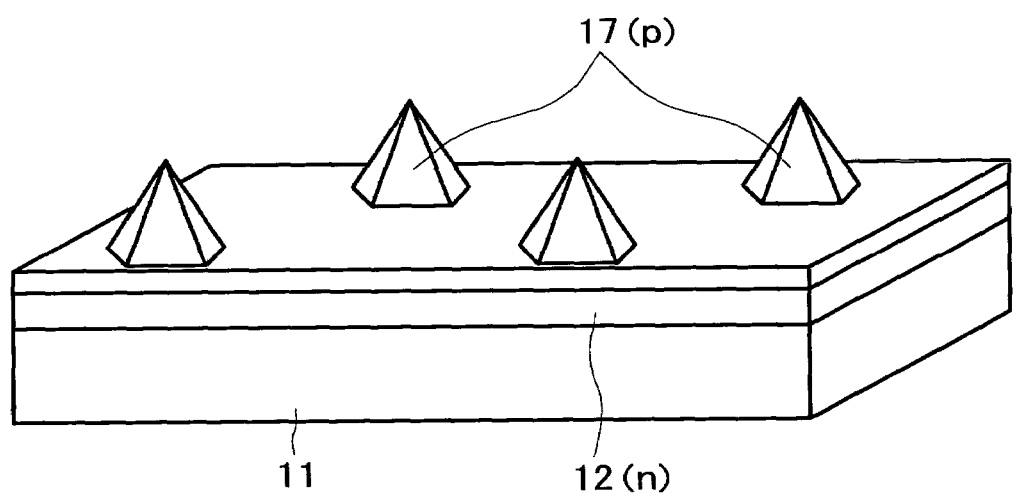
F I G. 4 B
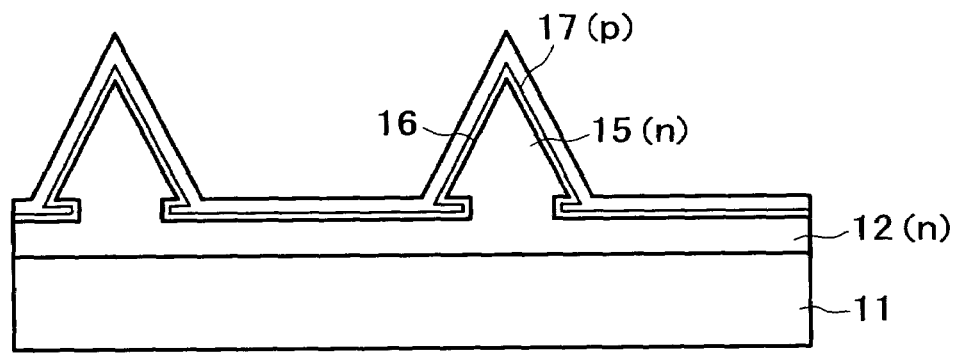

F I G. 6A
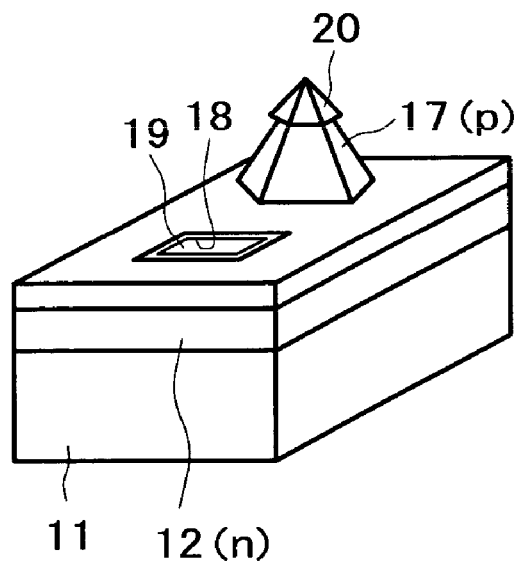
F I G. 6B
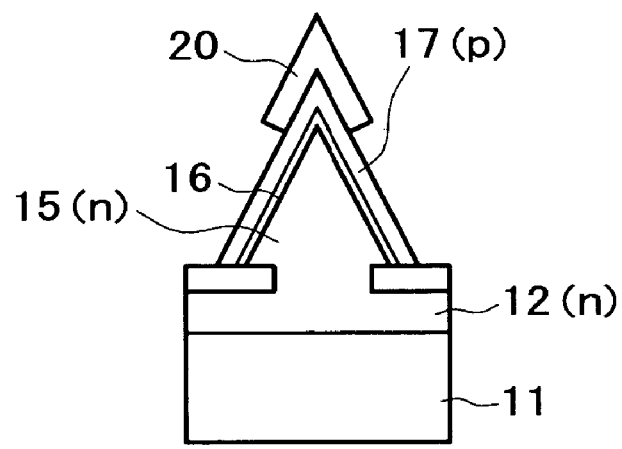

SEMICONDUCTOR LIGHT EMITTING DEVICE INTEGRAL TYPE SEMICONDUCTOR LIGHT EMITTING UNIT IMAGE DISPLAY UNIT AND ILLUMINATING UNIT

CROSS REFERENCE RELATED TO APPLICATIONS

This patent application claims priority to Japanese Patent Document No. P2002-261407 filed on Sep. 6, 2002, the disclosure of which is herein incorporated by reference.

BACKGROUND OF THE INVENTION

The present invention relates to a semiconductor light emitting device and a fabrication method thereof, an integral type semiconductor light emitting unit and a fabrication method thereof, an image display unit and a fabrication method thereof, and an illuminating unit and a fabrication method thereof. In particular, the present invention is suitably applied to light emitting diodes using nitride oxide type III–V compound semiconductors.

A related art light emitting diode representative of a semiconductor light emitting device as disclosed in WO02/07231 (see, for example pages 47–50, FIGS. 3 to 9), is configured by growing an underlying n-type GaN layer on a sapphire substrate, forming a growth mask having an opening at a specific position on the underlying n-type GaN layer, selectively growing a hexagonal pyramid shaped n-type GaN layer having tilt crystal planes tilted from a principal plane of a substrate on a portion, exposed from the opening of the growth mask, of the underlying GaN layer, and growing an active layer and a p-type GaN layer on the tilt crystal planes. According to such a light emitting diode, it is possible to improve the crystallinity of layers forming a device structure by suppressing the propagation of threading dislocations from the substrate side to the layers, and hence to enhance the luminous efficiency of the light emitting diode.

The above-described light emitting diode, however, has a problem. Although silicon oxide ($SiO_2$) or silicon nitride (SiN) is generally used as the material of the growth mask for selective growth, the use of such a silicon-based material is disadvantageous in that since the selective growth of the n-type GaN layer and the subsequent growth of the p-type GaN layer are both performed at a temperature being as high as about 100° C., silicon (Si) and oxygen (O) are released from the surface of the growth mask and incorporated in a portion, closed to the growth mask, of the growing layer upon growth of the GaN layers. The phenomenon becomes significant, particularly, at the time of growth of the p-type GaN layer. In this case, if Si functioning as an n-type impurity against GaN is incorporated in the growing layer at the time of growth of the p-type GaN layer, it is hard to ensure the p-type conduction of the p-type GaN layer, and even if the p-type conduction of the p-type GaN layer is ensured, the concentration of positive-holes and the mobility are both significantly reduced. This obstructs the improvement in luminous efficiency of the light emitting diode.

Another problem of the above-described related art light emitting diode is as follows. In the photolithography step required for forming the opening of the growth mask, a resist is brought into close-contact with a mask plane, followed by partial removal of the resist. In this removal of the resist, the resist is liable to remain in micro-gaps of the growth mask. Such a resist remaining in the micro-gaps is hard to be removed. As a result, at the subsequent growth at a high temperature, the remaining resist acts as an impurity source, tending to degrade characteristics of the GaN layers, particularly, the p-type GaN layer.

SUMMARY OF THE INVENTION

An advantage of the present invention is to provide a method of fabricating a semiconductor light emitting device, which is capable of easily fabricating a semiconductor light emitting device with the significantly improved luminous efficiency.

Another advantage of the present invention is to provide a semiconductor light emitting device with the significantly improved luminous efficiency.

A further advantage of the present invention is to provide a method of fabricating an image display unit, which is capable of fabricating an image display unit with the significantly improved luminous efficiency, and to provide an image display unit with the significantly improved luminous efficiency.

Yet a further advantage of the present invention is to provide a method of fabricating an illuminating unit, which is capable of fabricating an illuminating unit with the significantly improved luminous efficiency, and to provide an illuminating unit with the significantly improved luminous efficiency.

According to an embodiment of the present invention, there is provided a method of fabricating a semiconductor light emitting device, including the steps of growing a first semiconductor layer of a first conductive type on a substrate; forming a growth mask having an opening at a specific position on the first semiconductor layer; selectively growing a second semiconductor layer of the first conductive type on a portion, exposed from the opening of the growth mask, of the first semiconductor layer, removing the growth mask, and sequentially growing at least an active layer and a third semiconductor layer of a second conductive type so as to cover the second semiconductor layer.

The growth mask may be made from any kind of material insofar as nuclei creation on the growth mask is sufficiently smaller than nuclei creation on the first semiconductor layer at the time of growth of the second semiconductor layer, to allow selective growth of the second semiconductor layer on the first semiconductor layer, but preferably formed of a film that includes, for example, a silicon oxide ($SiO_2$) film, a silicon nitride (SiN, particularly $Si_3N_4$) film, a silicon oxynitride (SiON) film and the like, and a stacked film including two or more of the silicon oxide film, silicon nitride film, and silicon oxynitride film. The growth mask may be formed of an aluminum oxide ($Al_2O_3$) film, a tungsten (W) film and the like, or a stacked film including the aluminum oxide film or tungsten film and one or more of the silicon oxide film, the silicon nitride film, and the silicon oxynitride film.

The substrate may be made from any kind of material insofar as the substrate made from such a material allows each of the first semiconductor layer, the second semiconductor layer, the active layer, and the third semiconductor layer to be grown thereon with good crystallinity. In general, the substrate may be made from a material that includes sapphire ($Al_2O_3$, containing C-plane, A-plane, and R-plane), SiC (containing 6H, 4H, and 3C), nitride oxide based III–V compound semiconductors (for example, GaN, InAlGaN, and AlN), Si, ZnS, ZnO, LiMgO, GaAs, and $MgAl_2O_4$. Further, such a material used for the substrate preferably has a hexagonal system, although it may have a cubic system. For example, if each of the first semiconductor layer, the second semiconductor layer, the active layer, and the third semiconductor layer is made from a nitride oxide based III–V compound semiconductor, a sapphire substrate with a C-plane of sapphire taken as the principal plane can be used. The term "C-plane" used herein means not only the strict C-plane but also a crystal plane which is tilted from the strict C-plane at an angle of about 5° to about 6° and is regardable substantially as a C-plane.

The second semiconductor layer formed by selective growth is represented by the crystal layer having the tilt crystal planes tilted from the principal plane of the substrate. Each of the first semiconductor layer, the second semiconductor layer (that is, the crystal layer), the active layer, and the third semiconductor layer may be made from any material but is preferably made from a material having a wurtzite crystal structure. Examples of semiconductors each having such a wurtzite crystal structure include nitride oxide based III–V compound semiconductors, and II–VI compound semiconductors such as a BeMgZnCdS based compound semiconductor and BeMgZnCdO based compound semiconductor.

The nitride oxide based III–V compound semiconductor is generally expressed by a structural formula of $Al_xB_yGa_{1-x-y-z}In_zAs_uN_{1-u-v}P_v$ (where $0 \leq x \leq 1$, $0 \leq y \leq 1$, $0 \leq z \leq 1$, $0 \leq u \leq 1$, $0 \leq v \leq 1$, $0 \leq x+y+z<1$, $0 \leq u+v<1$), more specifically, by a structural formula of $Al_xB_yGa_{1-x-y-z}In_zN$ (where $0 \leq x \leq 1$, $0 \leq y \leq 1$, $0 \leq z \leq 1$, $0 \leq x+y+z<1$), and typically, by a structural formula of $Al_xGa_{1-x-z}In_zN$ (where $0 \leq x \leq 1$, $0 \leq z \leq 1$). Specific examples of the nitride oxide based III–V compound semiconductors include GaN, InN, AlN, AlGaN, InGaN, AlGaInN and the like. In this case, the tilt crystal planes are typically S-planes (particularly, $S^+$-planes). The term "S-plane" used herein means not only the strict S-plane but also a crystal plane which is tilted from the strict S-plane at an angle of about 5° to about 6° and is substantially considered as an S-plane.

The crystal layer composed of the second semiconductor layer is typically formed into a hexagonal pyramid shape having the S-planes as the tilt crystal planes or a hexagonal truncated pyramid shape having the S-planes as the tilt crystal planes and the C-plane as the upper plane. The electrode of the second conductive type side is formed on the second semiconductor layer. In this case, if the second semiconductor layer is formed into a hexagonal pyramid shape, the electrode may be formed mainly on the S-planes (tilt crystal planes) of the third semiconductor layer formed on the second semiconductor layer. On the other hand, if the second semiconductor layer is formed into a hexagonal truncated pyramid shape, the electrode may be formed on the C-plane (upper plane of the hexagonal truncated pyramid shape) of the third semiconductor layer formed on the second semiconductor layer. Preferably, the electrode is formed in such a manner as not to be overlapped with corners at the periphery of the upper plane of the hexagonal truncated pyramid shape, which corners are generally poor in crystallinity.

The crystal layer composed of the second semiconductor layer may be formed into a stripe shape extending in one direction.

In the case of growing a nitride oxide based III–V compound semiconductor, the crystal layer is relatively easy to grow on the S-planes and C-plane. In this case, if it is intended to grow the crystal layer on the S-plane, most of the thickness of the growth layer, for example, 90% or more of the thickness of the growth layer may be grown at a growth rate of about 10 $\mu$m/h. It is to be noted that the term "growth rate" means the supply amount of a source material, that is, the net growth rate of the nitride-oxide based III–V compound semiconductor per unit area of the growth portion. Accordingly, with respect to the growth rate, there is no problem for growth on the C-plane but care must be taken for growth on a tilt plane such as the S-plane.

If the growth rate is set to a value of less than about 10 $\mu$m/h, for example, 4 $\mu$m/h, the growth rate on the C-plane becomes significantly larger than the growth rate on the S-plane. This makes it difficult to grow the crystal layer on the S-plane to a sufficient thickness.

Accordingly, in the case of growing the growth layers including the active layer and the third semiconductor layer each of which is made from a nitride oxide based III–V compound semiconductor, preferably, at least 90% or more of the thickness of the growth layer is grown at a growth rate of about 10 $\mu$m/h or more. Meanwhile, in the case of growing the growth layer on the C-plane, if the growth rate is set in a range of about 10 $\mu$m/h or more, a large amount of pits may undesirably occur. Accordingly, in the case of growing the growth layer on the C-plane, preferably, the growth layer is grown at a growth rate of less than about 10 $\mu$m/h.

The second semiconductor layer is typically selectively grown in such a manner as to be spread in the lateral direction from the opening of the growth mask; however, the layer may be selectively grown within the opening of the growth mask.

After removal of the growth mask and before growth of the active layer, preferably immediately before growth of the active layer, a fourth semiconductor layer of the first conductive type may be grown on the second semiconductor layer. This leads to the following advantages. Firstly, if the active layer is grown directly so as to cover the second semiconductor layer after the removal of the growth mask, an oxide film or the like would be present at the interface between the second semiconductor layer and the active layer, leading to a problem of an adverse affect on the light emission characteristic of the active layer or the like. On the contrary, when the fourth semiconductor layer is first grown and then the active layer is grown thereon, it is possible to grow the active layer on a clean surface where an oxide film or the like is absent, and hence to obviate the problem. Secondly, where the substrate is exposed to the atmospheric air for removal of the growth mask, the surface of the second semiconductor layer is oxidized to form an oxide film non-uniformly, and, since the growth does not easily occur in the areas where the oxide film is abundant but occurs first in the areas where the oxide film is less present, at the time of growth of the active layer, the surface of the active layer is liable to be rugged. On the other hand, when the fourth semiconductor layer is grown on the active layer as described above, it is possible to grow the active layer on a clean surface where the oxide film or the like is absent, thereby promising an enhanced flatness of the surface of the active layer. Thirdly, since the growth rate is generally low at the time of selective growth of the second semiconductor layer, the surface (particularly, a C-plane layer) of the second semiconductor layer is liable to be comparatively wild and be poor in flatness; however, when the fourth semiconductor layer is grown at a sufficiently high growth rate so as to cover the second semiconductor layer, it is possible to fill up and flatten the ruggedness of the wild surface of the second semiconductor layer. Where the first semiconductor layer, the second semiconductor layer, the active layer, and the third semiconductor layer are composed of, for example, nitride based III–V compound semiconductors, examples of the material which can be used for the fourth semiconductor layer include nitride based III–V compound semiconductors such as GaN, InGaN, AlGaN, and AlGaInN.

Each of the first semiconductor, the second semiconductor layer, the active layer, and the third semiconductor layer may be grown by a metal organic chemical vapor deposition (MOCVD) process, or a hydride vapor-phase epitaxial or halide vapor-phase epitaxial growth (HVPE) process.

According to another embodiment of the present invention, there is provided a semiconductor light emitting device including a semiconductor layer of a first conductive type formed on one principal plane of a substrate, the semiconductor layer including a raised crystal portion having tilt crystal planes tilted from the principal plane, at least an active layer and a semiconductor layer of a second conductive type, the active layer and the semiconductor layer being sequentially stacked at least on the tilt crystal planes of the raised crystal portion, a first electrode electrically connected to the semiconductor layer of the first conductive type, and a second electrode electrically connected to the semiconductor layer of the second conductive type, the second electrode being provided on the semiconductor layer of the second conductive type on the raised crystal portion, wherein a size of the second electrode is in a range of about 50% or less of a size of the raised crystal portion on which the active layer and the semiconductor layer of the second conductive type have been stacked.

The size of the second electrode is preferably in a range of about 33% or less of the size of the raised crystal portion on which the active layer and the semiconductor layer of the second conductive type have been stacked.

According to another embodiment of the present invention, there is provided a method of fabricating an integral type semiconductor light emitting unit, including the steps of growing a first semiconductor layer of a first conductive type on a substrate, forming a growth mask having an opening at a specific position on the first semiconductor layer, selectively growing a second semiconductor layer of the first conductive type on a portion, exposed from the opening of the growth mask, of the first semiconductor layer, removing the growth mask, and sequentially growing at least an active layer and a third semiconductor layer of a second conductive type so as to cover the second semiconductor layer.

The integral type semiconductor light emitting device is applicable to any application, and is typically applied to an image display unit and an illuminating unit.

According to another embodiment of the present invention, there is provided an integral type light emitting unit including a stack of a plurality of light emitting devices, each of the light emitting devices including a semiconductor layer of a first conductive type formed on one principal plane of a substrate, the semiconductor layer including a raised crystal portion having tilt crystal planes tilted from the principal plane, at least an active layer and a semiconductor layer of a second conductive type, the active layer and the semiconductor layer being sequentially stacked at least on the tilt crystal planes of the raised crystal portion, a first electrode electrically connected to the semiconductor layer of the first conductive type, and a second electrode electrically connected to the semiconductor layer of the second conductive type, the second electrode being provided on the semiconductor layer of the second conductive type on the raised crystal portion, wherein a size of the second electrode is in a range of about 50% or less of a size of the raised crystal portion on which the active layer and the semiconductor layer of the second conductive type have been stacked.

The size of the second electrode is preferably in a range of about 33% or less of the size of the raised crystal portion on which the active layer and the semiconductor layer of the second conductive type have been stacked.

According to another embodiment of the present invention, there is provided a method of fabricating an image display unit, including the steps of growing a first semiconductor layer of a first conductive type on a substrate, forming a growth mask having an opening at a specific position on the first semiconductor layer, selectively growing a second semiconductor layer of the first conductive type on a portion, exposed from the opening of the growth mask, of the first semiconductor layer, removing the growth mask, and sequentially growing at least an active layer and a third semiconductor layer of a second conductive type so as to cover the second semiconductor layer.

According to another embodiment of the present invention, there is provided an image display unit including a semiconductor layer of a first conductive type formed on one principal plane of a substrate, the semiconductor layer including a raised crystal portion having tilt crystal planes tilted from the principal plane, at least an active layer and a semiconductor layer of a second conductive type, the active layer and the semiconductor layer being sequentially stacked at least on the tilt crystal planes of the raised crystal portion, a first electrode electrically connected to the semiconductor layer of the first conductive type, and a second electrode electrically connected to the semiconductor layer of the second conductive type, the second electrode being provided on the semiconductor layer of the second conductive type on the raised crystal portion, wherein a size of the second electrode is in a range of about 50% or less of a size of the raised crystal portion on which the active layer and the semiconductor layer of the second conductive type have been stacked.

The size of the second electrode is preferably in a range of about 33% or less of the size of the raised crystal portion on which the active layer and the semiconductor layer of the second conductive type have been stacked.

According to another embodiment of the present invention, there is provided a method of fabricating an illuminating unit, including the steps of growing a first semiconductor layer of a first conductive type on a substrate, forming a growth mask having an opening at a specific position on the first semiconductor layer, selectively growing a second semiconductor layer of the first conductive type on a portion, exposed from the opening of the growth mask, of the first semiconductor layer, removing the growth mask, and sequentially growing at least an active layer and a third semiconductor layer of a second conductive type so as to cover the second semiconductor layer.

According to another embodiment of the present invention, there is provided an illuminating unit including a semiconductor layer of a first conductive type formed on one principal plane of a substrate, the semiconductor layer including a raised crystal portion having tilt crystal planes tilted from the principal plane, at least an active layer and a semiconductor layer of a second conductive type, the active layer and the semiconductor layer being sequentially stacked at least on the tilt crystal planes of the raised crystal portion, a first electrode electrically connected to the semiconductor layer of the first conductive type, and a second electrode electrically connected to the semiconductor layer of the second conductive type, the second electrode being provided on the semiconductor layer of the second conductive type on the raised crystal portion, wherein a size of the second electrode is in a range of about 50% or less of a size of the raised crystal portion on which the active layer and the semiconductor layer of the second conductive type have been stacked.

The size of the second electrode is preferably in a range of about 33% or less of the size of the raised crystal portion on which the active layer and the semiconductor layer of the second conductive type have been stacked.

It is to be noted that the limitations and advantages described in the first aspect of the present invention basically hold for the second to eighth aspects of the present invention.

According to an embodiment of the present invention configured as described above, since the active layer and the third semiconductor layer having the second conductive type are grown after the growth mask is removed, even if the growth mask is made from silicon oxide or silicon nitride, there is no problem associated with incorporation of silicon released from the growth mask into the third semiconductor layer, and further, there is no problem associated with contamination due to the resist.

According to an embodiment of the present invention configured as described above, since the size of the second electrode is in a range of about 50% or less of the size of the raised crystal portion on which the active layer and the semiconductor layer having the second conductive type have been stacked, even if an abnormal growth portion occurs on the lower portion of the tilt crystal plane of the semiconductor layer having the second conductive type, the second electrode can be formed so as not to be overlapped with the abnormal growth portion.

Additional features and advantages of the present invention are described in, and will be apparent from, the following Detailed Description of the Invention and the figures.

BRIEF DESCRIPTION OF THE FIGURES

FIGS. 4A and 4B are a perspective view and a sectional view, showing a fabrication step continued from that shown in FIGS. 3A and 3B.

FIGS. 6A and 6B are a perspective view and a sectional view, showing a fabrication step continued from that shown in FIGS. 5A and 5B.

DETAILED DESCRIPTION OF THE INVENTION

Figure 1A:
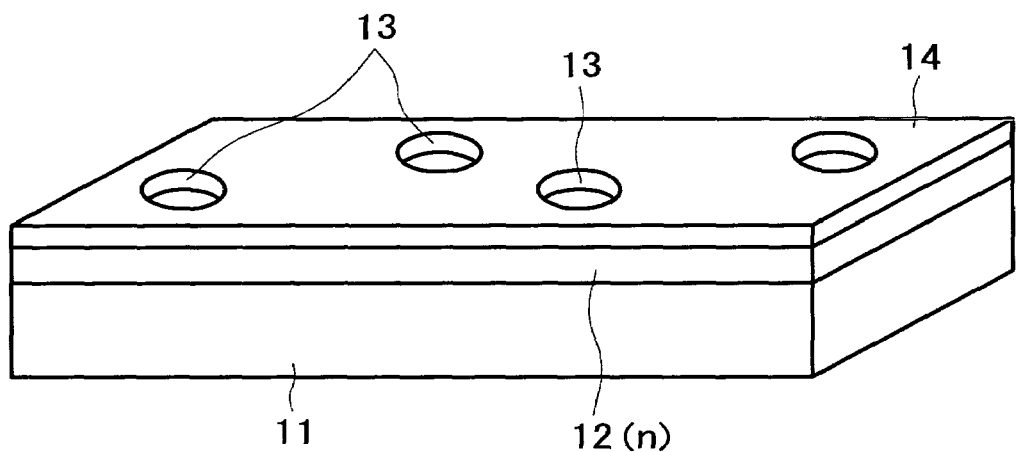
FIGS. 1A and 1B are a perspective view and a sectional view, showing an initial step of a method of fabricating a GaN based light emitting diode according to a first embodiment of the present invention.

The present invention will now be described in detail by way of preferred embodiments with reference to the drawings, in which like reference numerals denote like or corresponding parts.

Figure 7:
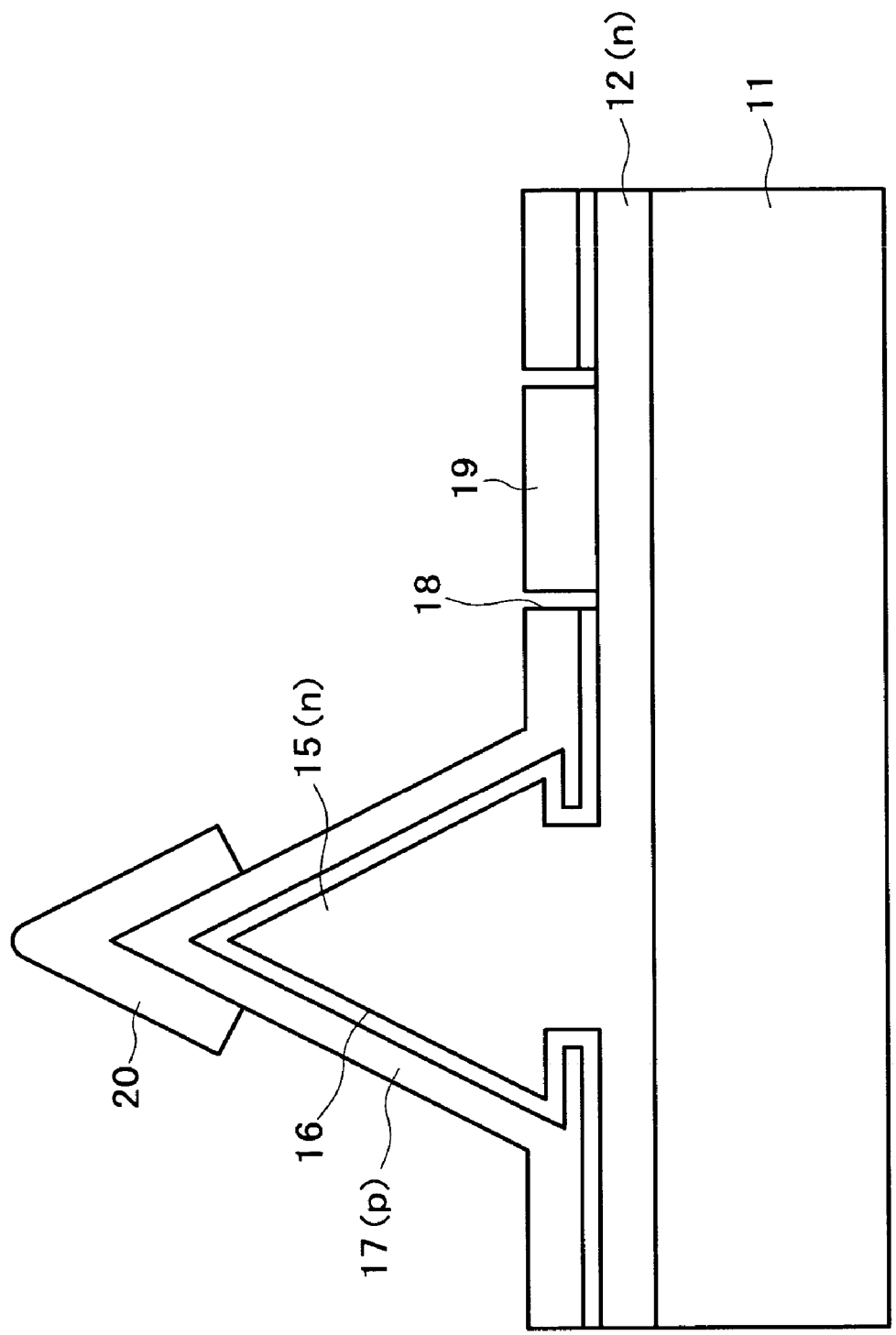
FIG. 7 is a sectional view of the final GaN based light emitting diode fabricated by the fabrication steps shown in FIGS. 1A to 6B.

FIGS. 1A to 6B show sequential steps of a process of fabricating a GaN based light emitting diode according to a first embodiment of the present invention, wherein FIGS. 1A, 2A, 3A, 4A, 5A and 6A are perspective views and FIGS. 1B, 2B, 3B, 4B, 5B, and 6B are sectional views; and FIG. 7 is a sectional view showing a final state of the GaN based light emitting diode fabricated by the fabrication process shown in FIGS. 1A to 6B.

Figure 1B:
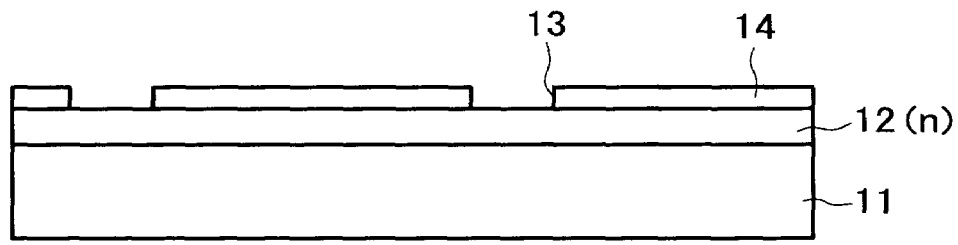

FIGS. 1A and 1B show a step of forming a growth mask. A sapphire substrate 11 with the C+-plane of sapphire taken as the principal plane is prepared. The surface of the sapphire substrate 11 is cleaned, for example, by thermal cleaning. An n-type GaN layer 12 doped with Si representative of an n-type impurity is grown on the cleaned surface of the sapphire substrate 11, for example, by a MOCVD (Metal Organic Chemical Vapor-phase Deposition) process. The n-type GaN layer 12 is preferably grown in such a manner that the density of crystal defects, particularly, threading dislocations in the layer 12 is made as small as possible. It is generally sufficient for the thickness of the n-type GaN layer 12 to be in a range of about 2 $\mu$m or more. The n-type GaN layer 12 with reduced crystal defects can be formed in accordance with various known methods. One example of such methods involves growing a GaN buffer layer or an AlN buffer layer (not shown) on the sapphire substrate 11 at a low temperature, for example, about 500° C., increasing the temperature to about 1000° C. for crystallization of the buffer layer, and growing the n-type GaN layer 12 on the crystallized buffer layer.

A SiO$_2$ film having a thickness of about 100 nm is formed on the entire surface of the n-type GaN layer 12 by a CVD process, vacuum vapor-deposition process, or sputtering process. A resist pattern (not shown) having a specific shape is formed on the SiO$_2$ film by lithography, and the SiO$_2$ film is patterned by etching using the resist pattern as a mask, to form a growth mask 14 having specific openings located at specific device formation positions. The etching may be performed by wet etching using an etching solution such as hydrofluoric acid or RIE (Reactive Ion Etching) using an etching gas containing fluorine in the form of CF$_4$ or CHF$_3$. The shape of the opening 13 is preferably a circular shape, although it may be a hexagonal shape with one side extending in parallel to the <11–20> direction. The diameter of the opening 13 may be determined depending on requirements of the final light emitting diode. In general, the diameter of the opening 13 is set to about 10 $\mu$m.

Figure 2A:
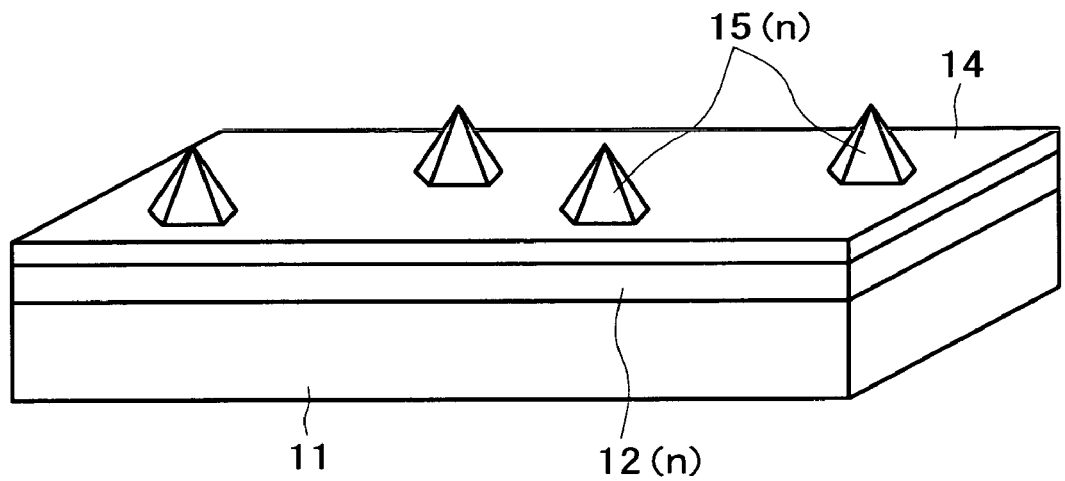
FIGS. 2A and 2B are a perspective view and a sectional view, showing a fabrication step continued from that shown in FIGS. 1A and 1B.
Figure 2B:
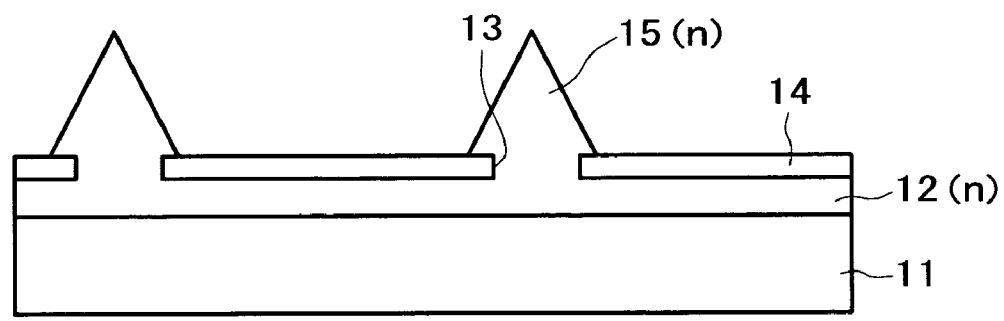

FIGS. 2A and 2B show a step of selectively growing an n-type GaN layer. An n-type GaN layer 15 doped with Si representative of an n-type impurity is selectively grown on a portion of the n-type GaN layer 12, which portion is exposed from each of the openings 13 of the growth mask 14. The n-type GaN layer 15 selectively grown from the opening 15 is formed into a hexagonal pyramid shape having six planes composed of S-planes tilted from the principal plane of the sapphire substrate 11. The size of the hexagonal pyramid shaped n-type GaN layer 15 may be determined depending on requirements of the final light emitting device, and in this embodiment, the size of the GaN layer 15 is selected to be slightly larger than the diameter of the opening 13.

Figure 3A:
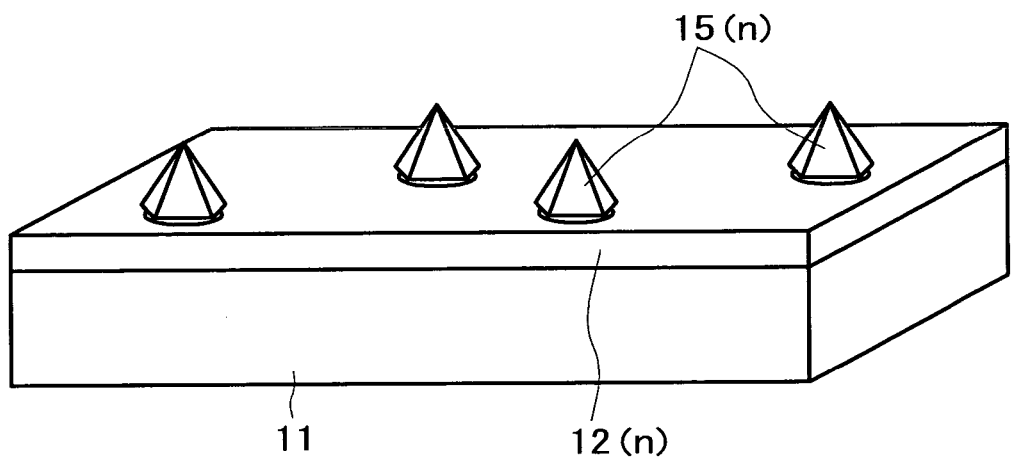
FIGS. 3A and 3B are a perspective view and a sectional view, showing a fabrication step continued from that shown in FIGS. 2A and 2B.
Figure 3B:
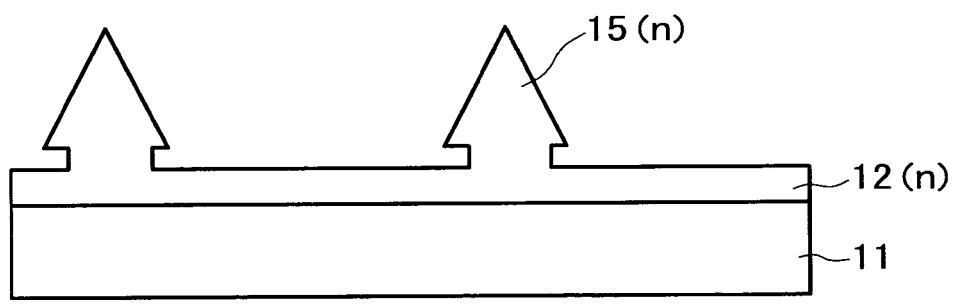

FIGS. 3A and 3B show a step of removing the growth mask. The growth mask 14 is removed by etching, for example, wet etching using an etching solution such as hydrofluoric acid or RIE using an etching gas such as fluorine in the form of CF$_4$ or CHF$_3$. A GaN semi-finished substrate provided with the hexagonal pyramid shaped structures of the n-type GaN layer 15 selectively grown on the n-type GaN layer 12 is thus obtained.

The GaN semi-finished substrate is put in a reaction chamber of an MOCVD system. In this reaction chamber, the surface of the GaN semi-finished substrate is subjected to thermal cleaning for about 1 min to about 2 min.

FIGS. 4A and 4B show a step of forming a light emitting diode structure. An InGaN based active layer 16 and a p-type GaN layer 17 doped with Mg representative of a p-type impurity are sequentially grown on the GaN semi-finished substrate at a growth rate preferably in a range of about 10 $\mu$m/h or more. A double-hetero light emitting diode structure is thus obtained by the hexagonal pyramid shaped n-type GaN layer 15 and the active layer 16 and the p-type GaN layer 17 grown on the tilt crystal planes of the GaN layer 15.

The thickness of each of the active layer 16 and the p-type GaN layer 17 may be determined depending on requirements of the final light emitting diode. In this embodiment, the thickness of the active layer 16 is set to about 3 $\mu$m, and the thickness of the p-type GaN layer 17 is set to about 0.2 $\mu$m. The growth temperature of the active layer 16 as one of the GaN based semiconductor layers is set in a range of about 650° C. to about 800° C., and the growth temperature of the p-type GaN layer 17 as the other of the GaN based semiconductor layers is set in a range of about 900° C. to about 1050° C. The active layer 16 may be a single InGaN layer, or a multi-quantum well structure in which two InGaN layers different in In (indium) content are alternately stacked. The In content is determined depending on a desired emission wavelength.

At the time of forming the p-type GaN layer 17, the concentration of Mg in the uppermost portion of the layer 17 is preferably increased in order to take good ohmic contact with a p-side electrode to be described later. A p-type InGaN layer doped with Mg representative of a p-type impurity, which is easy to take good ohmic contact, may be grown as a p-type contact layer on the p-type GaN layer 17, and a p-side electrode may be formed on such a contact layer.

If needed, an n-type GaN layer doped with Si representative of an n-type impurity may be thinly grown on the GaN semi-finished substrate immediately before the active layer 16 is grown, and then the active layer 16 be grown on the n-type GaN layer. With this configuration, since the active layer 16 is grown on the clean surface of the n-type GaN layer, it is possible to certainly obtain the active layer 16 with good crystallinity. In this case, it is experimentally found that the growth temperature is, preferably, initially set to about 850° C. and gradually increased to about 950° C. The heat-treatment at the time of the above-described thermal cleaning has an effect that since the top of the hexagonal pyramid shaped n-type GaN layer 15 is slightly rounded and thereby the top of each of the active layer 16 and the p-type GaN layer 17 grown thereon is also slightly rounded, the p-side electrode is formed in a region, including the rounded top, of the p-type GaN layer 17. This is advantageous in that the problem concerning degradation of the p-side electrode with elapsed time, caused by concentration of an electric field at the top and its neighborhood of the p-type GaN layer 17 upon operation of the light emitting diode, can be alleviated as compared with the formation of the p-side electrode in a region, including a sharp top, of the p-type GaN layer 17.

It is important that the growth mask 14 is not present at the time of growth of the active layer 16 and the p-type GaN layer 17. Accordingly, even if a SiO$_2$ film or SiN film is used as the growth mask 14, there is no problem associated with incorporation of Si released from the SiO$_2$ film or SiN film into the growing layer at the time of growth of the p-type GaN layer 17, and also there is no problem associated with contamination due to the resist.

In addition, if the growth of the above-described GaN based semiconductor layers is performed at a growth temperature of about 1000° C., the supply amount of a source material for Ga (gallium) is required to be significantly increased, for example, to about 100 μmol/min or more.

The source materials used for growth of the above-described GaN based semiconductor layers can include as follows: trimethyl gallium ((CH$_3$)$_3$Ga, TMG) for Ga; trimethyl aluminum ((CH$_3$)$_3$Al, TMA) for Al; trimethyl indium ((CH$_3$)$_3$In, TMI) for In; and NH$_3$ for N. Dopants used for growth of the GaN based semiconductor layers can include as follows: silane (SiH$_4$) as an n-type dopant; and bis(methyl cyclopentadienyl magnesium) ((CH$_3$C$_5$H$_4$)$_2$Mg) or bis(cyclopentadienyl magnesium ((C$_5$H$_5$)$_2$Mg) as a p-type dopant.

Carrier gas atmospheres at the time of growth of the above-described GaN based semiconductor layers may be selected as follows: a mixed gas of N$_2$ and H$_2$ for growth of the n-type GaN layer 12 and the n-type GaN layer 15; N$_2$ gas for growth of the active layer 16; and a mixed gas of N$_2$ and H$_2$ for growth of the p-type GaN layer 17. In this case, since the N$_2$ atmosphere containing no H$_2$ is used as the carrier gas atmosphere at the time of growth of the active layer 16, it is possible to suppress the release of In and hence to prevent degradation of the active layer 16; and since the mixed gas of N$_2$ and H$_2$ is used as the carrier gas atmosphere at the time of growth of the p-type GaN layer 17, it is possible to grow the p-type GaN layer 17 with good crystallinity.

The sapphire substrate 11 on which the GaN based semiconductor layers have been grown as described above is taken out of the MOCVD system.

Figure 5A:
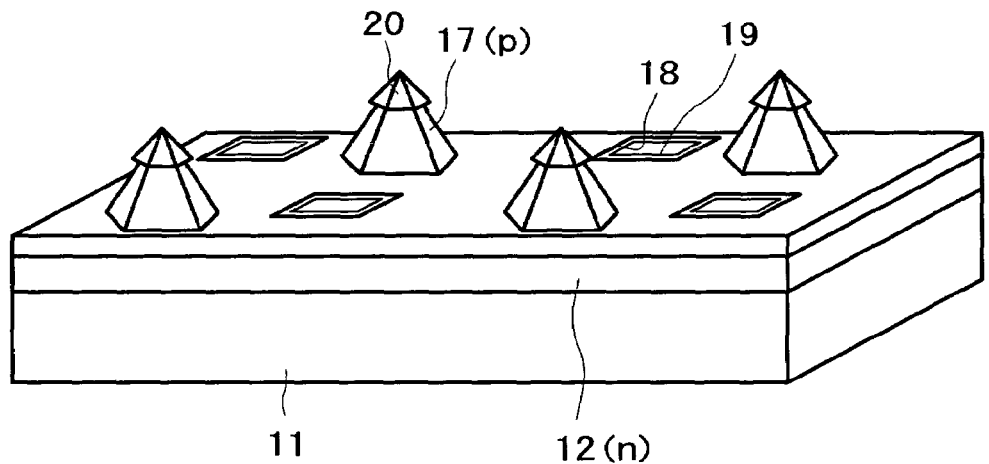
FIGS. 5A and 5B are a perspective view and a sectional view, showing a fabrication step continued from that shown in FIGS. 4A and 4B.
Figure 5B:
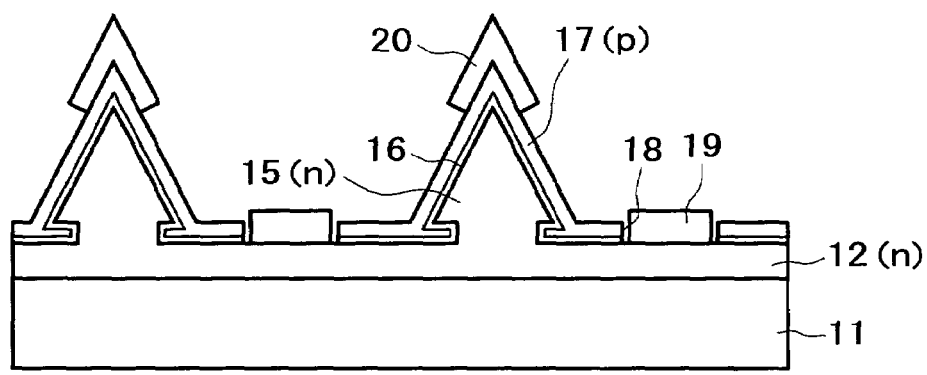

FIGS. 5A and 5B show a step of forming an n-side electrode and a p-side electrode.

A resist pattern (not shown) is formed by lithography in such a manner as to cover a region, excluding n-side electrode formation areas separated from the hexagonal pyramid shaped structures of the n-type GaN layer 15, of the p-side GaN layer 17.

The p-type GaN layer 17 and the active layer 16 are etched by, for example, RIE using the resist pattern as a mask, to form openings 18 from which the n-type GaN layer 12 is exposed. The resist pattern is then removed.

A Ti film, a Pt film, and an Au film are sequentially formed on the entire surface of the substrate by, for example, a vacuum vapor-deposition process, and a resist pattern having a specific shape is formed on the stacked film by lithography. The Ti film, Pt film, and Au film are etched using the resist pattern as a mask, to form n-side electrodes 19 each having a Ti/Pt/Ay structure, which electrode is in contact with the n-type GaN layer 12 through the opening 18 formed in both the p-type GaN layer 17 and the active layer 16.

A p-side electrode 20 having a Ni/Pt/Au structure is formed in a region, including the top, of the active layer 16 and the p-type GaN layer 17 grown on the hexagonal pyramid shaped n-type GaN layer 1S.

The substrate, on which the light emitting diode structures have been formed, is cut into chips by etching, for example, RIE or using a dicer. The chipped GaN based light emitting diode is shown in FIG. 6. FIG. 7 is a sectional view of the GaN based light emitting diode in the final state.

As a result of drive of the GaN based light emitting diode by applying a current between the p-side electrode 20 and the n-side electrode 19, light emission having an emission wavelength ranging from 380 to 620 nm depending on the In content of the active layer 16 was observed through the sapphire substrate 11.

Figure 8:
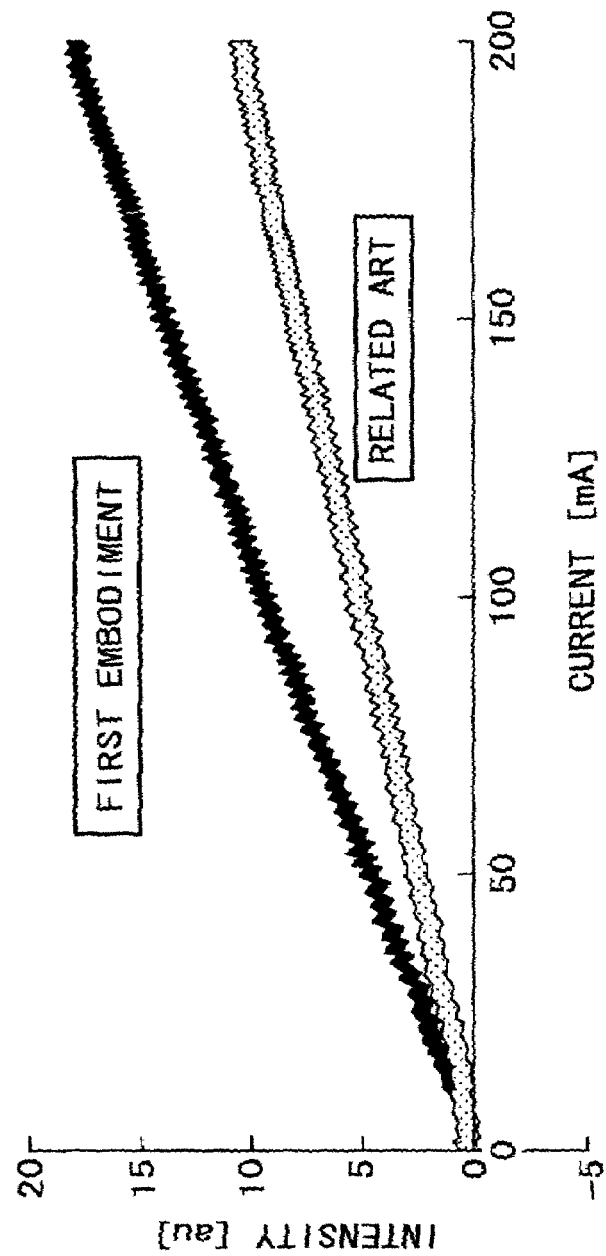
FIG. 8 is a graph showing a relationship between a current and an optical characteristic in the GaN based light emitting diode according to the first embodiment of the present invention.

FIG. 8 shows a current-optical characteristic of the GaN based light emitting diode, and a comparative current-optical characteristic of a related art general GaN based light emitting diode of a type in which the device structure is formed by growing GaN based semiconductor layers without formation of a hexagonal pyramid shaped n-type GaN layer. As is apparent from FIG. 8, the luminous efficiency of the GaN based light emitting diode according to this embodiment is as large as about two or three times the luminous efficiency of the related art GaN based light emitting diode. The reason for this may be due to the facts that it is possible to allow light emitted from the active layer 16 to efficiently emerge to external by the effect of the hexagonal pyramid shaped device structure, and to solve the problem associated with degradation of the p-type conduction due to release of Si from the growth mask 14 and hence to reduce the resistivity of the p-type GaN layer 17.

Figure 9:
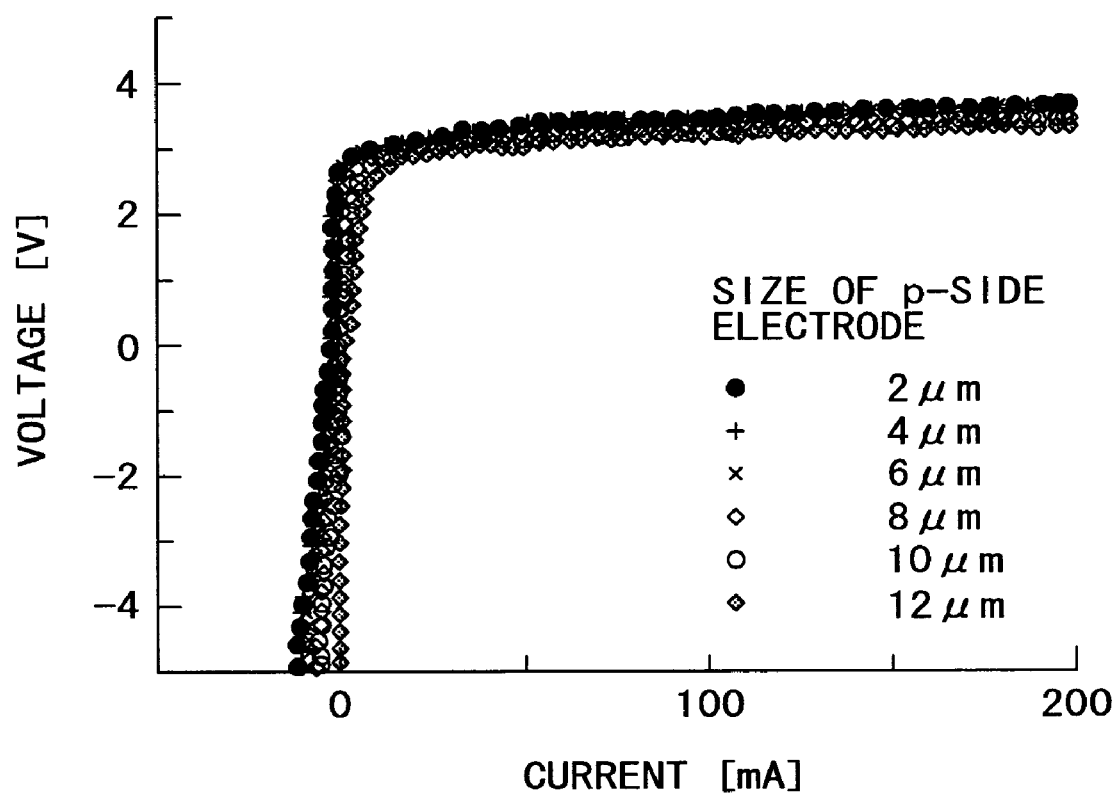
FIG. 9 is a graph showing a relationship between a current and a voltage with the size of a p-side electrode taken as a parameter in the GaN based light emitting diode according to the first embodiment of the present invention.
Figure 10:
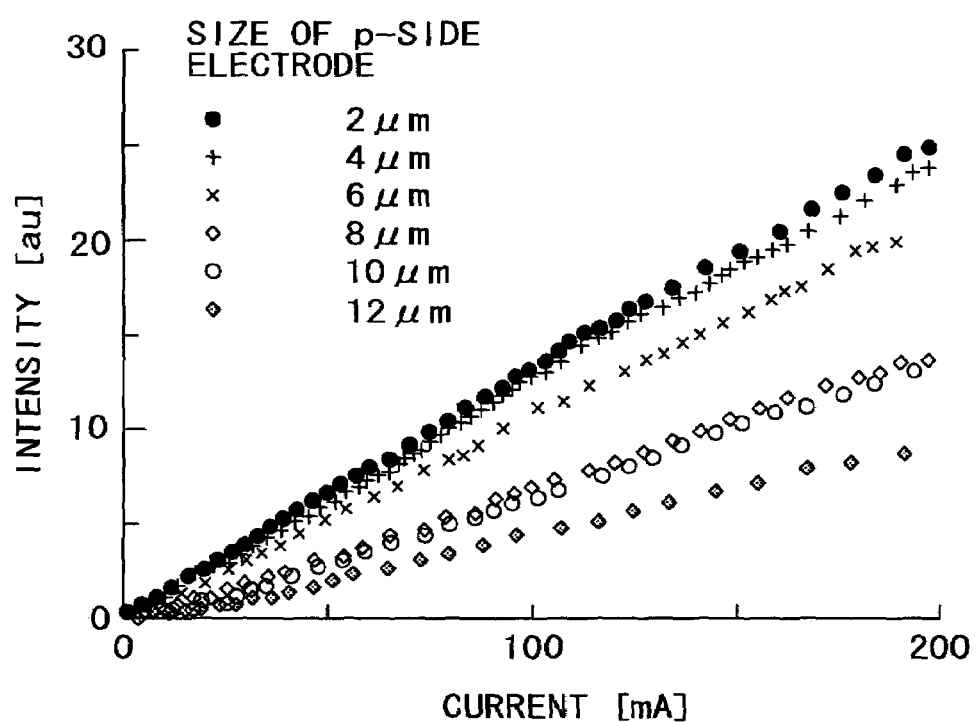
FIG. 10 is a graph showing a relationship between a current and an optical characteristic with the size of the p-side electrode taken as a parameter in the GaN based light emitting diode according to the first embodiment of the present invention.
Figure 11:
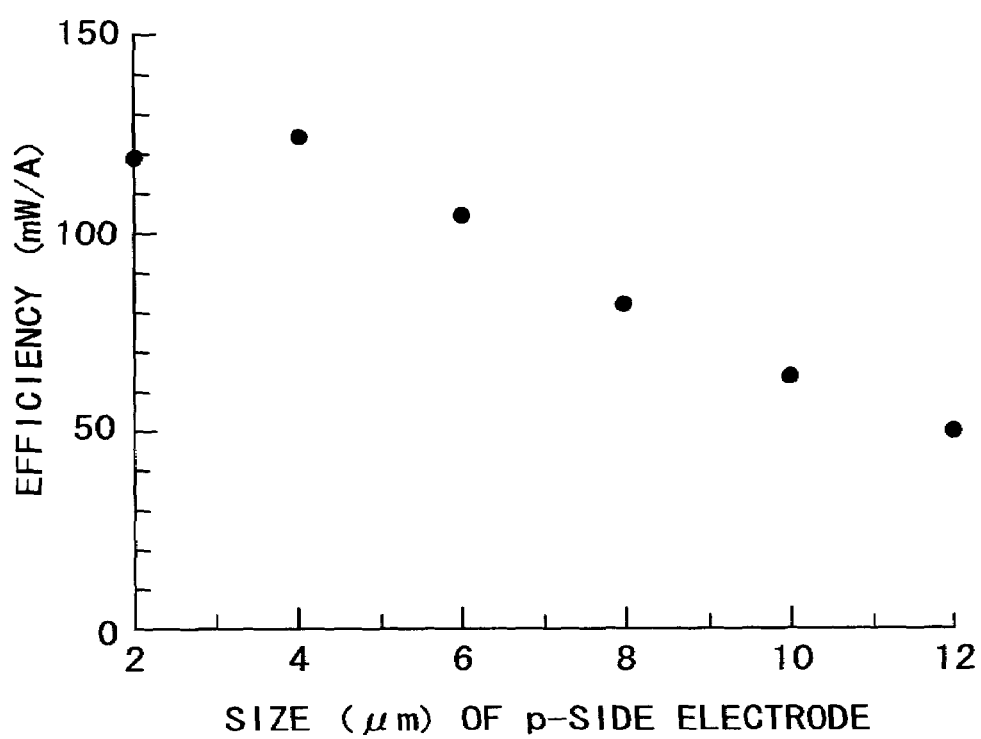
FIG. 11 is a graph showing a relationship between the size of the p-side electrode and a luminous efficiency in the GaN based light emitting diode according to the first embodiment of the present invention.

FIGS. 9, 10, and 11 show results of examining light emission characteristics of the GaN based light emitting diode, wherein the size of the hexagonal pyramid shaped n-type GaN layer 17 is set to about 12 μm, and the size of the p-side electrode 20 is varied stepwise with a pitch of 2 μm in a range of 2 to 12 μm, wherein FIG. 9 shows a current-voltage characteristic, FIG. 10 is a current-optical power characteristic, and FIG. 11 is a relationship between the size of the electrode and the luminous efficiency.

The data of FIGS. 9, 10 and 11 show that the optimum size of the p-side electrode 20 from the viewpoint of the light emission characteristic is in a range about 6 μm or less, that is, in a range of 50% or less of the size of the hexagonal pyramid shaped n-type GaN layer 15. Accordingly, on the basis of such experimental data, it is apparent that the luminous efficiency can be maximized by setting the size of the p-side electrode 20 in a range of about 50% or less of the size of the hexagonal pyramid shaped p-side GaN layer 17, that is, setting the ratio of the area of the p-side electrode 20 to the area of the hexagonal pyramid shaped GaN layer 17 in a range of about 25% or less. From the data of FIG. 11, it is apparent that the luminous efficiency can be further enhanced by setting the size of the p-side electrode 20 in a range of about 33% or less of the size of the hexagonal pyramid shaped p-type GaN layer 17, or setting the ratio of the area of the p-side electrode 20 to the area of the hexagonal pyramid shaped p-type GaN layer 17 in a range of about 11% or less.

Figure 12A:
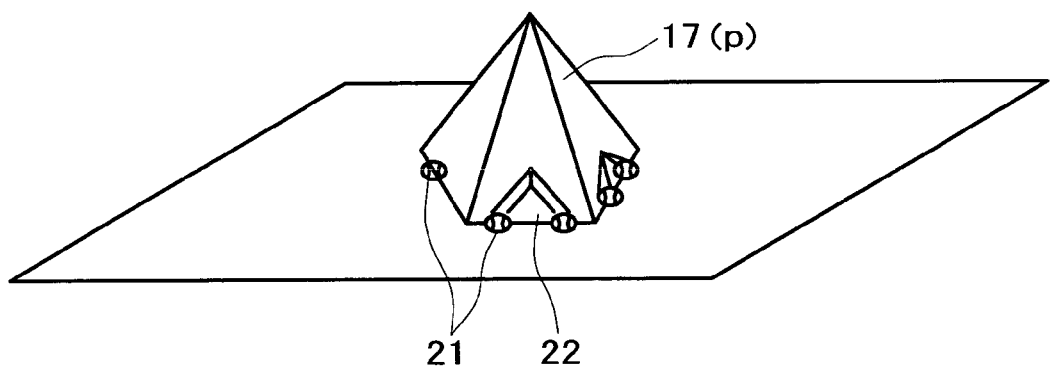
FIGS. 12A and 12B are schematic views illustrating size reduction of the p-side electrode in the GaN based light emitting diode according to the first embodiment of the present invention.
Figure 12B:
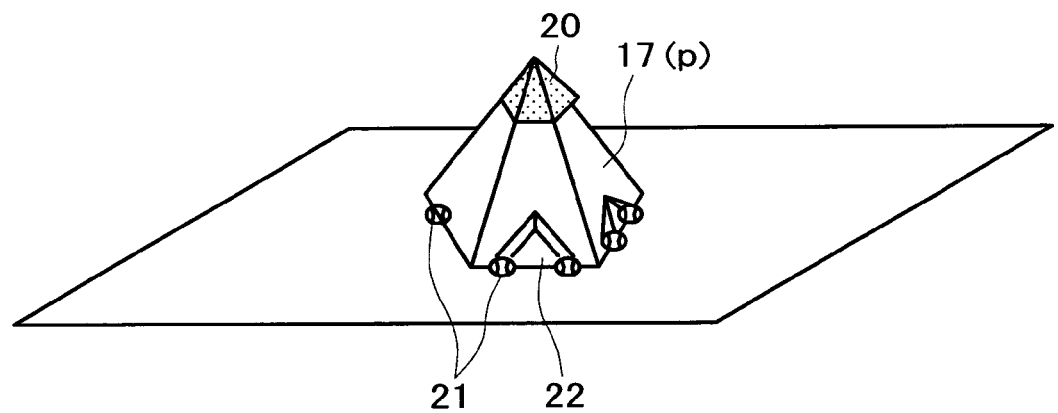

The reason why the luminous efficiency is enhanced by setting the size of the p-side electrode 20 in a range of about 50% or less of the size of the hexagonal pyramid shaped GaN layer 17 may be conceived as follows. As shown in FIG. 12A, which shows the state immediately after the growth of the p-type GaN layer 17, pits 21 are present on the lower side of the hexagonal pyramid shaped p-type GaN layer 17 and abnormal growth portions 22 are formed in the vicinity of the pits 21. If the p-side electrode 20 is formed on the abnormal growth portions 22, the contact characteristic of the p-side electrode 20 is degraded, to lower the luminous efficiency. In this regard, according to this embodiment, as shown in FIG. 12B, since the size of the p-side electrode 20 is set in a range of about 50% or less of the size of the hexagonal pyramid shaped p-side GaN layer 17, the p-side electrode 20 can be formed in such a manner as not to be overlapped to the abnormal growth portions 22.

As described above, according to the first embodiment, after the hexagonal pyramid shaped n-type GaN layer 15 is selectively grown on the n-type GaN layer 12 through the opening 13 formed in the growth mask 14 made from $SiO_2$, the growth mask 14 is removed by etching, and thereafter, the active layer 16 and the p-type GaN layer 17 are grown on the hexagonal pyramid shaped n-type GaN layer 15. Accordingly, there is no problem associated with incorporation of Si released from the growth mask 14 into the growing layer at the time of growth of the p-type GaN layer 17. As a result, it is possible to form the p-type GaN layer 17 doped with a sufficient amount of Mg and thereby having a low resistivity, and hence to improve the luminous efficiency of the GaN based light emitting diode. Also, since the size of the p-side electrode 20 is set in a range of about 50% or less of the size of the hexagonal pyramid shaped p-side GaN layer 17, it is possible to maximize the luminous efficiency of the GaN based light emitting diode, and hence to significantly improve the luminous efficiency.

If the opening 18 is formed in the p-side GaN layer 17 and the active layer 16 by dry etching, for example, RIE in order to form the n-side electrode 19, or if the p-type GaN layer 17 and the active layer 16 are etched by dry etching, for example, RIE in order to separate the device from another device for fabricating an integrated semiconductor light emitting unit, it is difficult to avoid occurrence of damage of the active layer 16. On the contrary, according to this embodiment, since the portion at which damage may occurs is sufficiently separated from a light emission region including the p-side electrode 20 and its neighborhood ranging from about 2 to about 5 μm, such damage does not exert any adverse effect on the light emission characteristics of the device.

A GaN based light emitting diode according to a second embodiment of the present invention will be described below with reference to FIG. 13.

Figure 13:
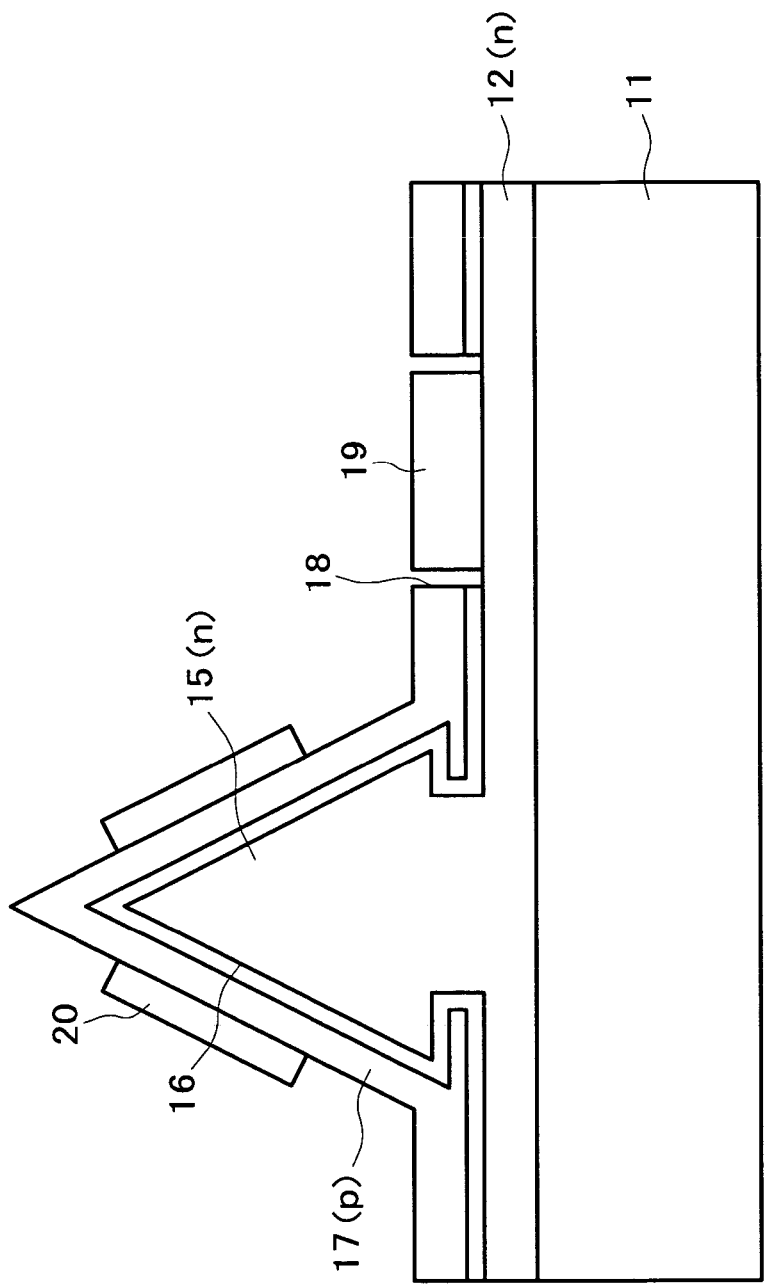
FIG. 13 is a sectional view showing a GaN based light emitting diode according to a second embodiment of the present invention.

In the second embodiment, as shown in FIG. 13, a p-side electrode 20 is not formed in the vicinity of the top of a hexagonal pyramid shaped p-type GaN layer 17 but is formed to cover only middle portions of tilt planes of the layer 17. To be more specific, the size of the p-side electrode 20 is set in a range of about 50% or less of the size of the hexagonal pyramid shaped p-type GaN layer 17 and the p-side electrode 20 is not formed in the vicinity of the top of the layer 17. As a result of observation using an AFM (Atomic Force Microscope), it is apparent that the crystallinity of a portion, in the vicinity of the top, of the hexagonal pyramid shaped p-type GaN layer 17 is poorer than that of another portion. From this viewpoint, according to this embodiment, the p-side electrode 20 is formed in a region, excluding the top and its neighborhood in which the crystallinity is poor, of the hexagonal pyramid shaped p-type GaN layer 17, and further, as described in the first embodiment, the size of the p-side electrode 20 is set in a range of about 50% or less of the size of the layer 17. As a result, the p-side electrode 20 can be formed in such a manner as not to be overlapped to the abnormal growth portions 22.

According to the second embodiment, it is possible to obtain not only the same advantage as that of the first embodiment can be obtained, but also an additional advantage that the luminous efficiency of the GaN based light emitting diode can be further improved because the size of the p-side electrode 20 is set in a range of about 50% or less of the size of the hexagonal pyramid shaped p-type GaN layer 17 and the p-side electrode 20 is not formed in the vicinity of the top of the layer 17.

Figure 14:
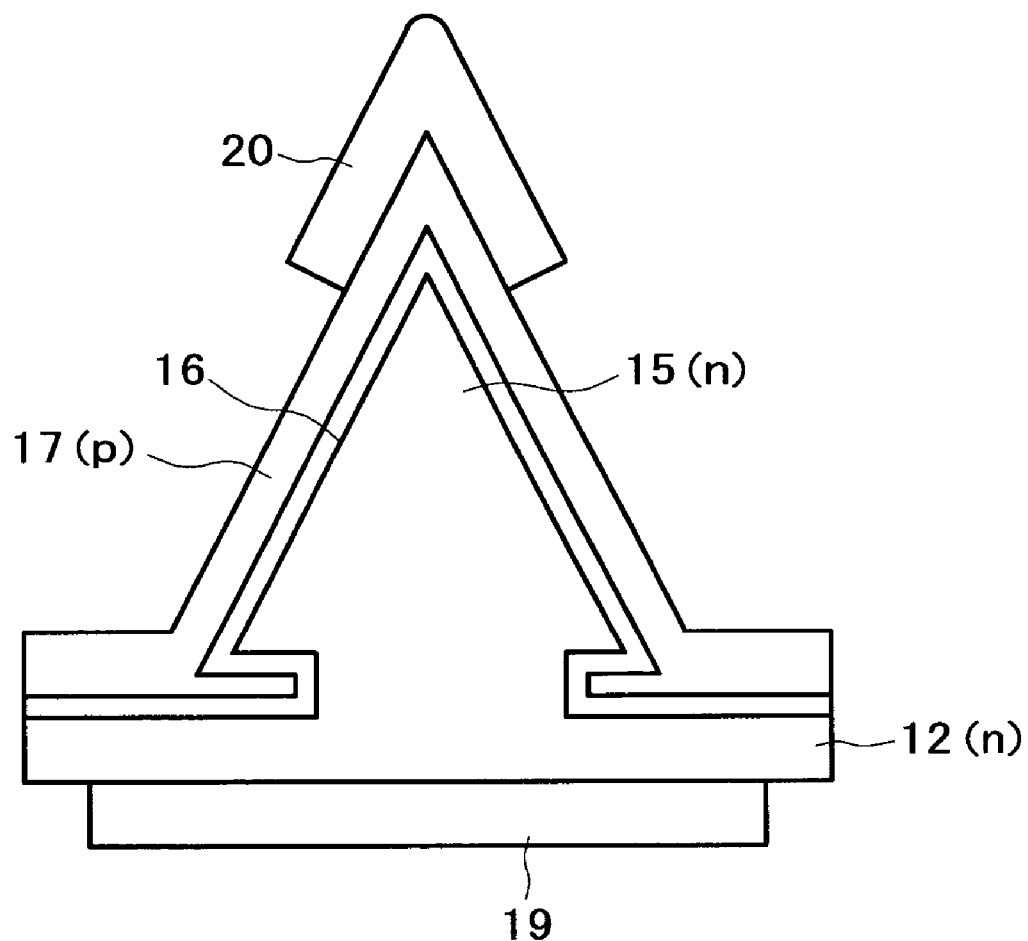
FIG. 14 is a sectional view showing a GaN based light emitting diode according to a third embodiment of the present invention.
Figure 15:
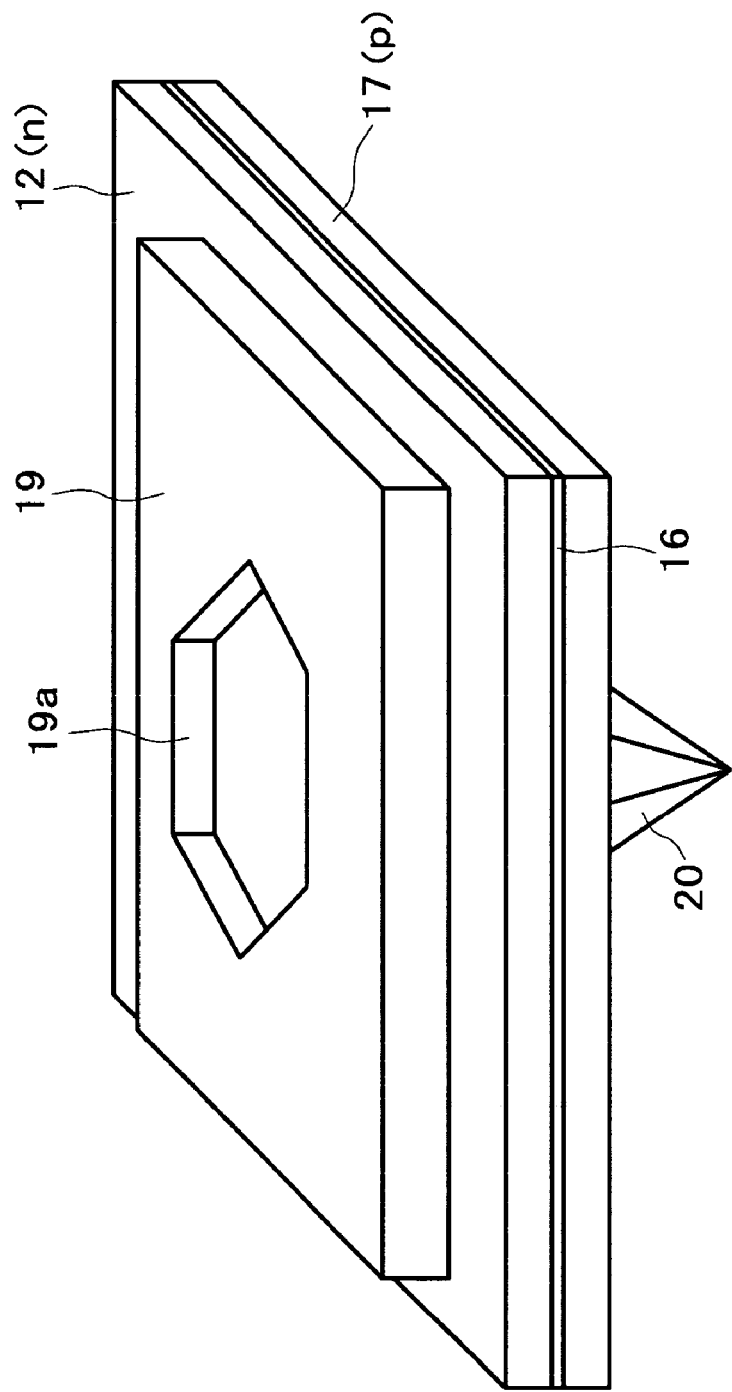
FIG. 15 is a perspective view, as seen from the n-side electrode side, of the GaN based light emitting diode according to the third embodiment of the present invention.

A GaN based light emitting diode according to a third embodiment of the present invention will be described below with reference to FIGS. 14 and 15.

The same steps as those in the first embodiment are repeated until a p-type GaN layer 17 is grown on a hexagonal pyramid shaped structure, and then a p-side electrode 20 is formed on the p-type GaN layer 17. The stacked layer structure, which includes the n-type GaN layer 12 and the hexagonal pyramid shaped structure formed thereon, is peeled from the sapphire substrate 11 by irradiating the sapphire substrate 11 with laser beams such as excimer laser beams from the back surface side of the sapphire substrate 11. The back surface of the n-type GaN layer 12 of the stacked layer structure thus peeled is flattened by etching or the like, and as shown in FIG. 14, an n-side electrode 19 is formed on the back surface of the n-type GaN layer 12. The n-side electrode 19 may be configured as a transparent electrode made from ITO (Indium Tin Oxide). In this case, the n-side electrode 19 can be formed on the back surface of the n-type GaN layer 12 so as to extend in a wide range including a portion corresponding to the hexagonal pyramid shaped structure. If the n-side electrode 19 is configured as a metal stacked film having a Ti/Pt/Au structure, in order to allow emission of light to external through the n-type GaN layer 12, an opening 19a is formed in a portion, corresponding to the hexagonal pyramid structure, of the n-side electrode 19 as shown in FIG. 15.

According to the third embodiment, the same effect as that obtained in the first embodiment can be obtained.

An image display unit according to a fourth embodiment of the present invention will be described with reference to FIG. 16.

Figure 16:
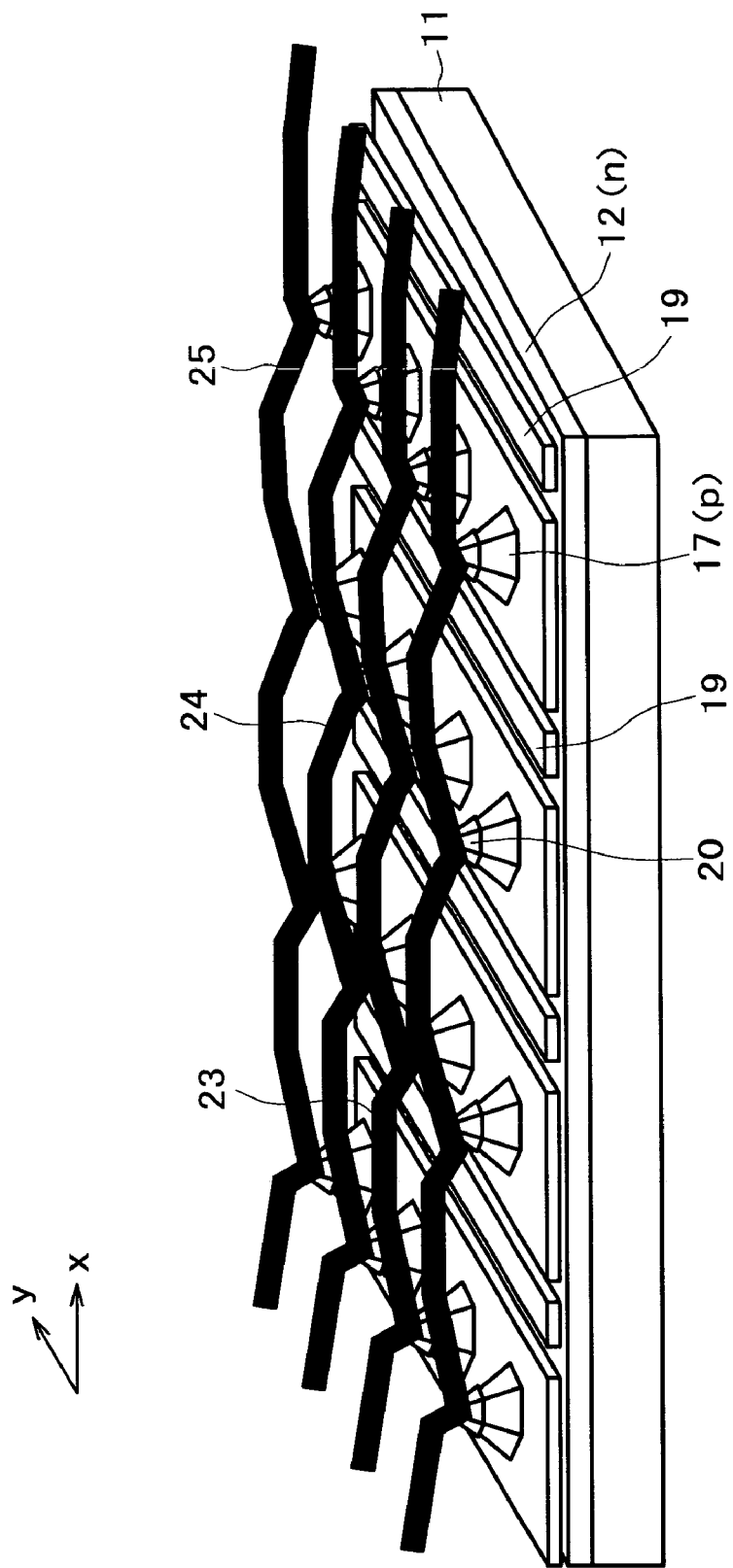
FIG. 16 is a perspective view showing an image display unit according to a fourth embodiment of the present invention.

Referring to FIG. 16, there is shown an image display unit according to this embodiment, which includes a two-dimensional array of GaN based light emitting devices regularly arranged in the x-direction and y-direction perpendicular to each other within the principal plane of a sapphire substrate 11. The structure of each of the GaN based light emitting diodes may be the same as that described in the first embodiment.

The GaN based light emitting diodes for emission of light of red (R), the GaN based light emitting diodes for emission of light of green (G), and the GaN based light emitting diodes for emission of light of blue (B) are alternately arranged in the y-direction in this order in such a manner as to be adjacent to each other. A set of three of these GaN based light emitting diodes for emission of light of R, G and B form one pixel. P-side electrodes 20 of the GaN based light emitting diodes for emission of red arranged in line in the x-direction are connected to each other by means of a wiring line 23; p-side electrodes 20 of the GaN based light emitting diodes for emission of green arranged in line in the x-direction are connected to each other by means of a wiring line 24: and p-side electrodes 20 of the GaN based light emitting diodes for emission of blue arranged in line in the x-direction are connected to each other by means of a wiring line 25. On the other hand, n-side electrodes extend in the y-direction, each of which is taken as a common electrode for the GaN based light emitting diodes arranged in line in the y-direction.

In such a single matrix type image display device configured as described above, specific wiring lines 23 to 25 and a specific n-side electrode 19 are selected in response to a signal indicative of an image to be displayed, and a current is applied to the GaN based light emitting diodes of the selected pixel, to emit light, thereby displaying the image.

According to the fourth embodiment, since each of the GaN based light emitting diodes of the image display unit has the same configuration as that described in the first embodiment, it is possible to enhance the luminous efficiency of the light emitting diodes. This is advantageous in realizing a full-color image display having a high luminance.

An illuminating unit according to a fifth embodiment of the present invention will be described below. The illuminating unit has the same configuration as that of the image display unit shown in FIG. 16.

In this illuminating unit, specific wiring lines 23 to 25 and a specific n-side electrodes 19 are selected in response to a signal indicative of a desired color of illumination light, and a current is applied to the GaN based light emitting diodes of the selected pixel, to emit light, thereby generating illumination light.

According to the fifth embodiment, since each of the GaN based light emitting diodes of the illuminating unit has the same configuration as that described in the first embodiment, it is possible to enhance the luminous efficiency of the light emitting diodes. This is advantageous in realizing an illuminating unit having a high luminance.

Figure 23:
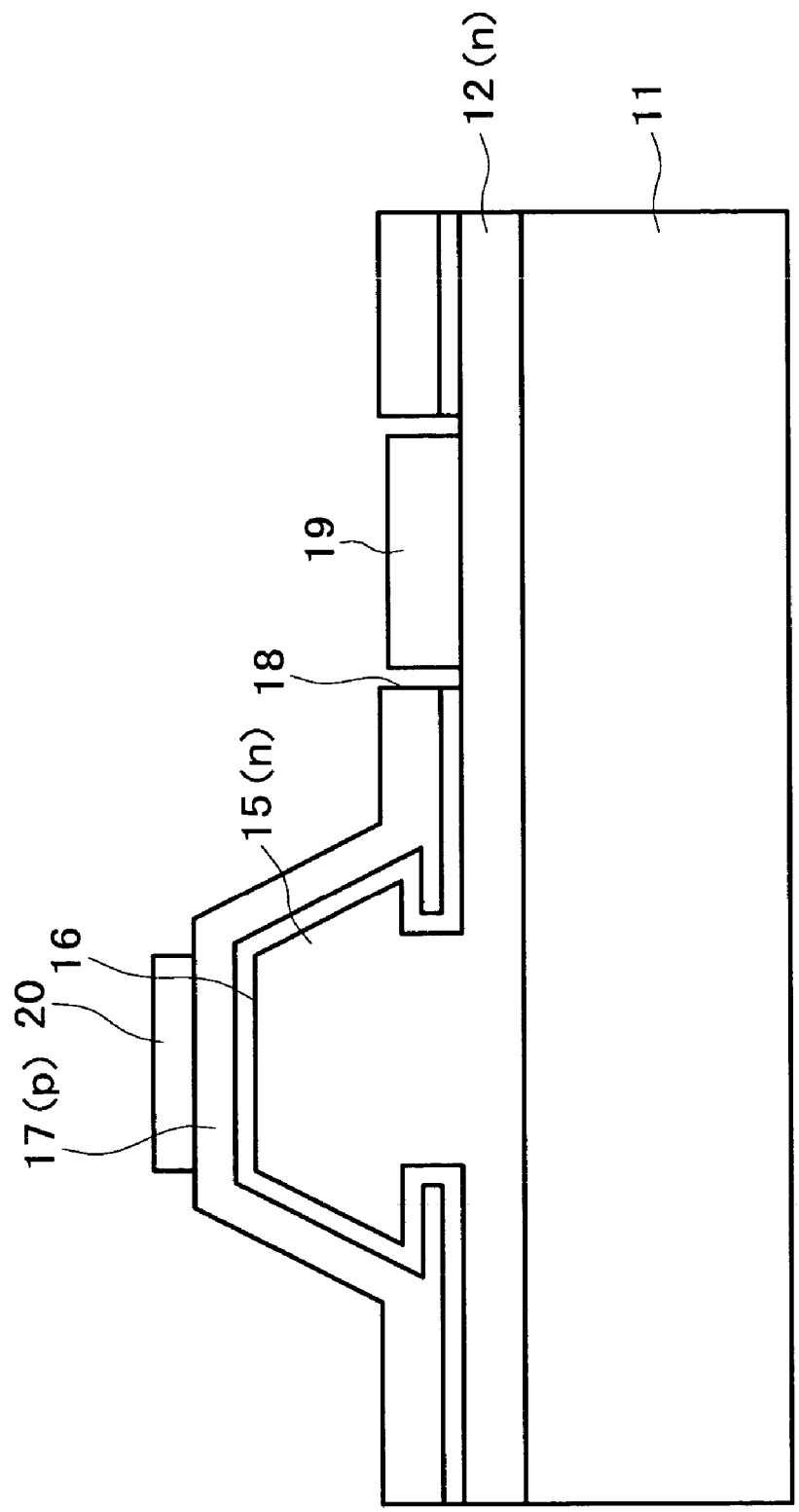
FIG. 23 is a sectional view of the final GaN based light emitting diode fabricated by the fabrication steps shown in FIGS. 17A to 22B.

FIGS. 17A to 22B show sequential steps of a process of fabricating a GaN based light emitting diode according to a sixth embodiment of the present invention, wherein FIGS. 17A, 18A, 19A, 20A, 21A, and 22A are perspective views, and FIGS. 17B, 18B, 19B, 20B, 21B, and 22B are sectional views; and FIG. 23 is a sectional view showing the final state of the GaN based light emitting diode.

Figure 17A:
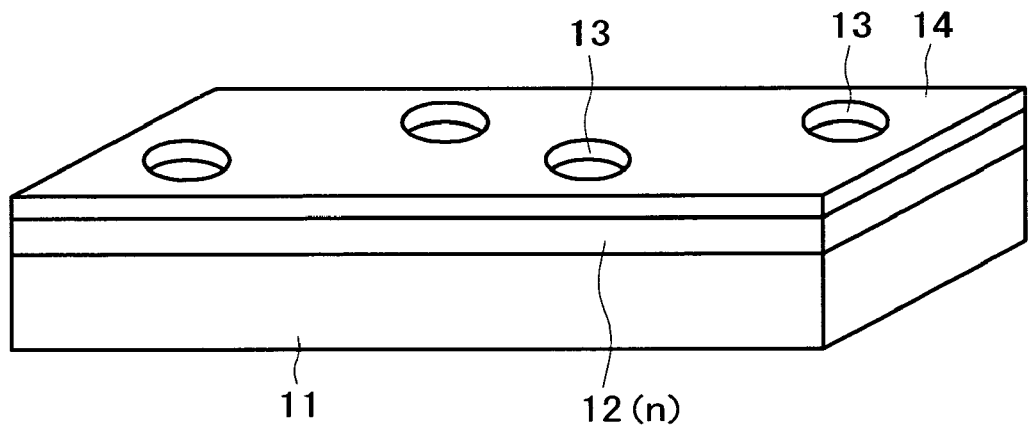
FIGS. 17A and 17B are a perspective view and a sectional view, showing an initial step of a method of fabricating a GaN based light emitting diode according to a sixth embodiment of the present invention.
Figure 17B:
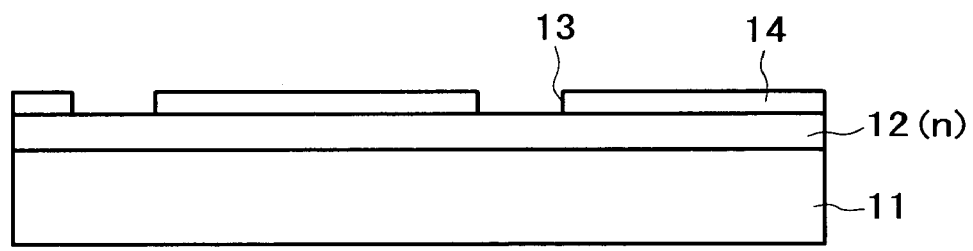

According to the sixth embodiment, the same steps as those in the first embodiment are repeated until a growth mask 14 having openings 13 are formed as shown in FIGS. 17A and 17B.

Figure 18A:
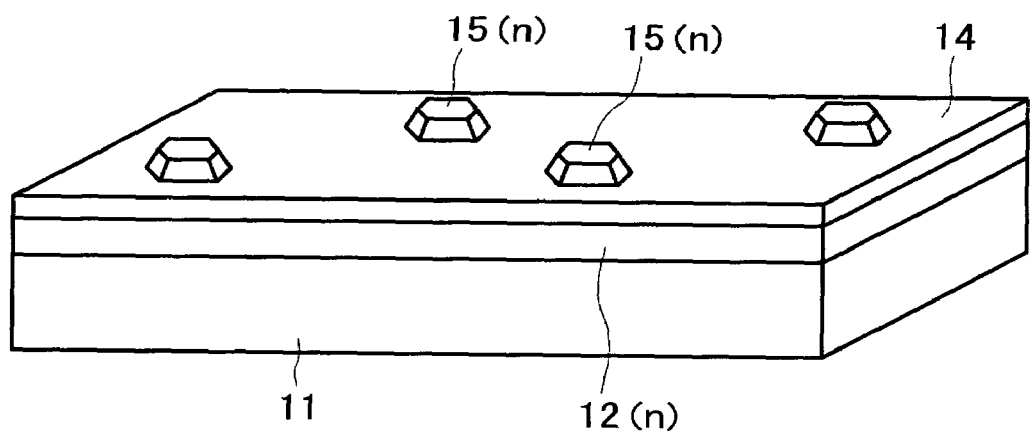
FIGS. 18A and 18B are a perspective view and a sectional view, showing a fabricating step continued from that shown in FIGS. 17A and 17B.
Figure 18B:
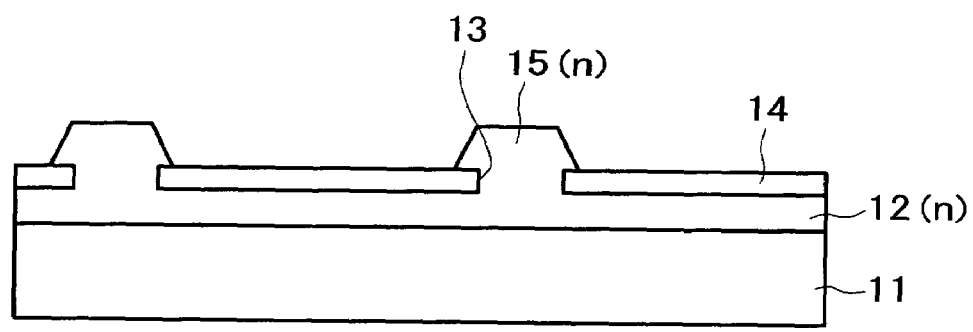

As shown in FIGS. 18A and 18B, like the first embodiment, an n-type GaN layer 15 is grown on a portion of the n-type GaN layer 12, which portion is exposed from each of the openings 13. The n-type GaN layer 15 is grown into a hexagonal pyramid shape; however, according to this embodiment, the growth of the n-type GaN layer 15 is stopped before the hexagonal pyramid shape having a sharp top is formed, whereby the n-type GaN layer 15 is formed into a hexagonal truncated pyramid shape having six side planes composed of S-planes and an upper plane composed of a C-plane. The size of the hexagonal truncated pyramid shaped n-type GaN layer 15 may be determined depending on requirements of the final light emitting device, and in this embodiment, the size of the layer 15 is determined such that the diametrical dimension is set to about 10 μm and the height is set in a range of about 5 to about 10 μm.

Figure 19A:
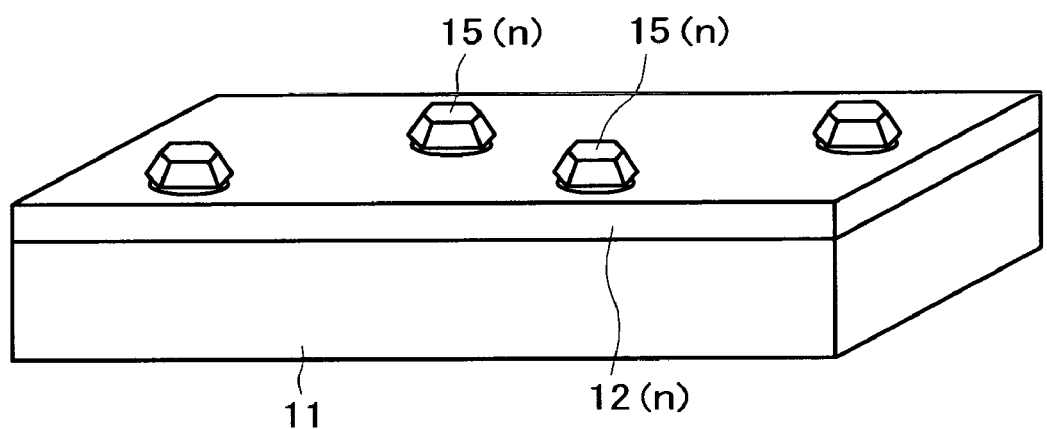
FIGS. 19A and 19B are a perspective view and a sectional view, showing a fabricating step continued from that shown in FIGS. 18A and 18B.
Figure 19B:
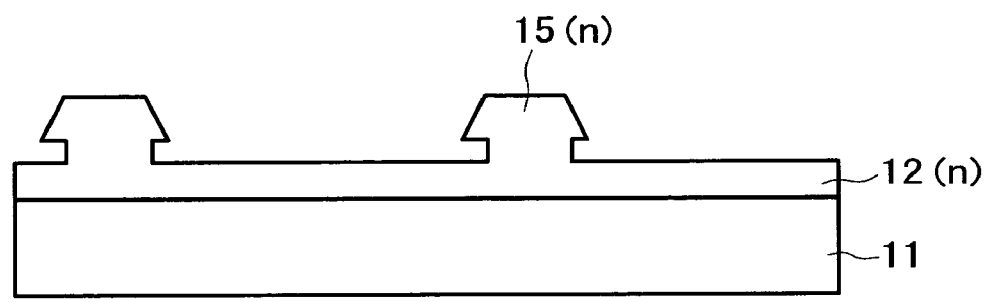

As shown in FIGS. 19A and 19B, like the first embodiment, the growth mask 14 is removed by etching, to obtain a GaN semi-finished substrate provided with the hexagonal truncated pyramid shaped structures of the n-type GaN layer 15 selectively grown on the n-type GaN layer 12.

Figure 20A:
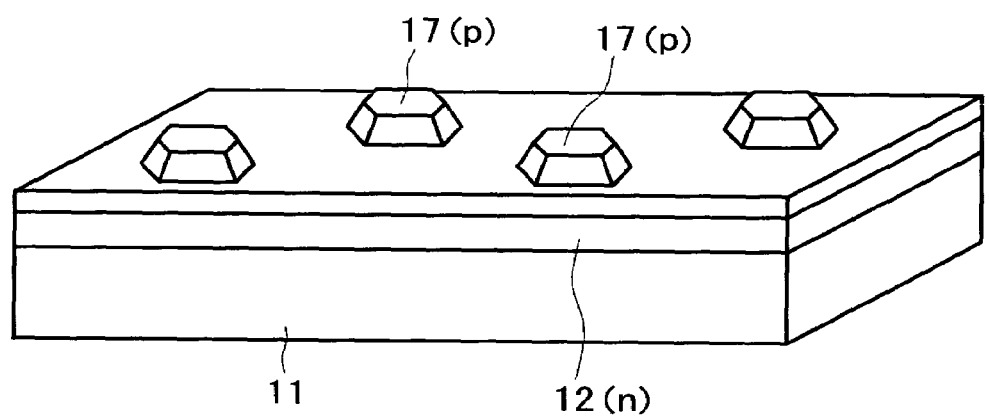
FIGS. 20A and 20B are a perspective view and a sectional view, showing a fabricating step continued from that shown in FIGS. 19A and 19B.
Figure 20B:
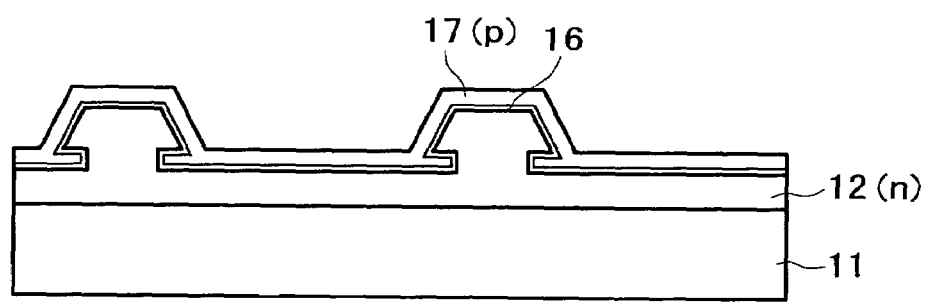

The GaN semi-finished substrate is put in a reaction chamber of an MOCVD system, and like the first embodiment, the surface of the substrate is cleaned, and as shown in FIGS. 20A and 20B, an InGaN based active layer 16 and a p-type GaN layer 17 doped with Mg representative of a p-type impurity are sequentially formed on the GaN semi-finished substrate at a growth rate preferably in a range of less than 10 μm/h in such a manner as to cover each of the hexagonal pyramid shaped structures. A light emitting diode having a double-hetero structure is thus obtained by the hexagonal truncated pyramid shaped n-type GaN layer 15 and the active layer 16 and the p-type GaN layer 17 grown on the upper plane and the tilt crystal planes of the layer 15.

It is important that like the first embodiment, the growth layer 14 is not present at the time of growth of the active layer 16 and the p-type GaN layer 17. As a result, if a SiO$_2$ film is used as the growth mask 14, there is no problem associated with incorporation of Si released from the growth mask 14 into the growing layer at the time of growth of the p-type GaN layer 17, and also there is no problem associated with contamination due to the resist.

The sapphire substrate 11 on which the GaN based semiconductor layers have been grown is taken out of the MOCVD system.

Figure 21A:
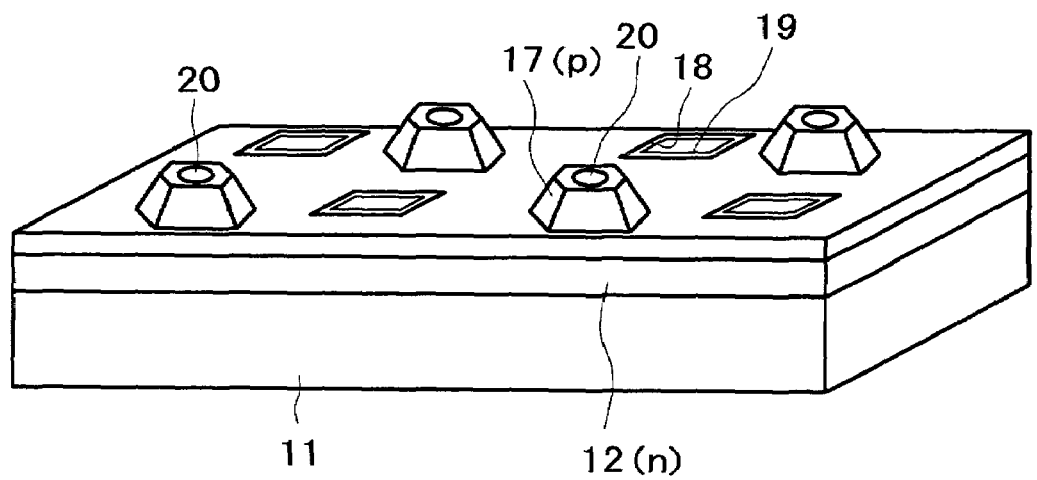
FIGS. 21A and 21B are a perspective view and a sectional view, showing a fabricating step continued from that shown in FIGS. 20A and 20B.
Figure 21B:
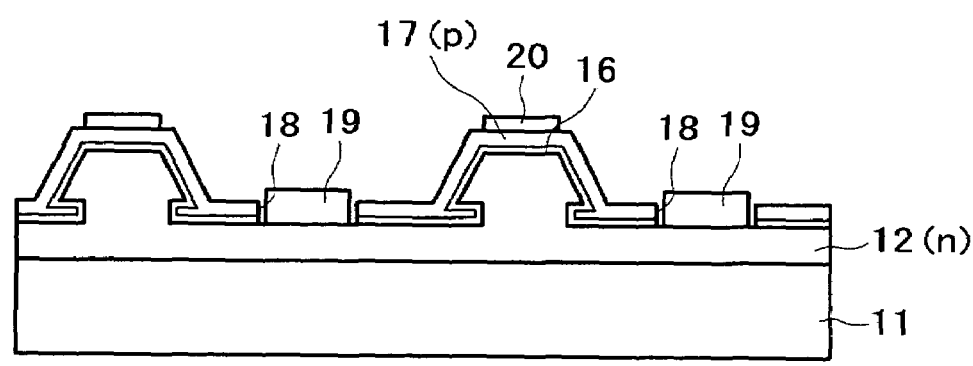
Figure 22A:
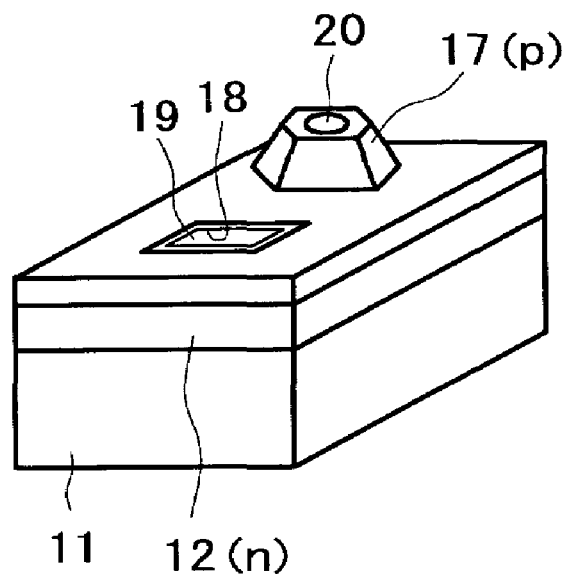
FIGS. 22A and 22B are a perspective view and a sectional view, showing a fabricating step continued from that shown in FIGS. 21A and 21B.
Figure 22B:
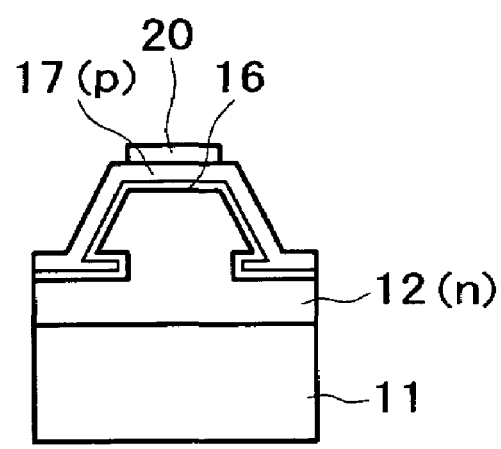

As shown in FIGS. 21A and 21B, like the first embodiment, openings 18 are formed in the p-type GaN layer 17 and the active layer 16, to expose the n-type GaN layer 12 from the openings 18. An n-side electrode 19 is formed in such a manner as to be in contact with the n-type GaN layer 12 through the opening 18.

A p-side electrode 20 having a Ni/Pt/Au structure is formed on the upper plane of the hexagonal truncated pyramid structure including the n-type GaN layer 15 and the active layer 16 and the p-type GaN layer 17 grown on the n-type GaN layer 15. The p-side electrode 20 is preferably formed in such a manner as to avoid corners between the upper plane and each of the side planes of the hexagonal truncated pyramid structure. This is because the crystallinity of each of the active layer 16 and the p-type GaN layer 17 in the vicinities of the corners is poorer than that of any another portion.

The substrate provided with the light emitting diode structures is cut into chips by etching, for example, RIE or using a dicer. The chipped GaN based light emitting diode is shown in FIG. 22. FIG. 23 is a sectional view of the GaN based light emitting diode in the final state.

The other configurations of this embodiment are the same as those in the first embodiment.

Figure 24:
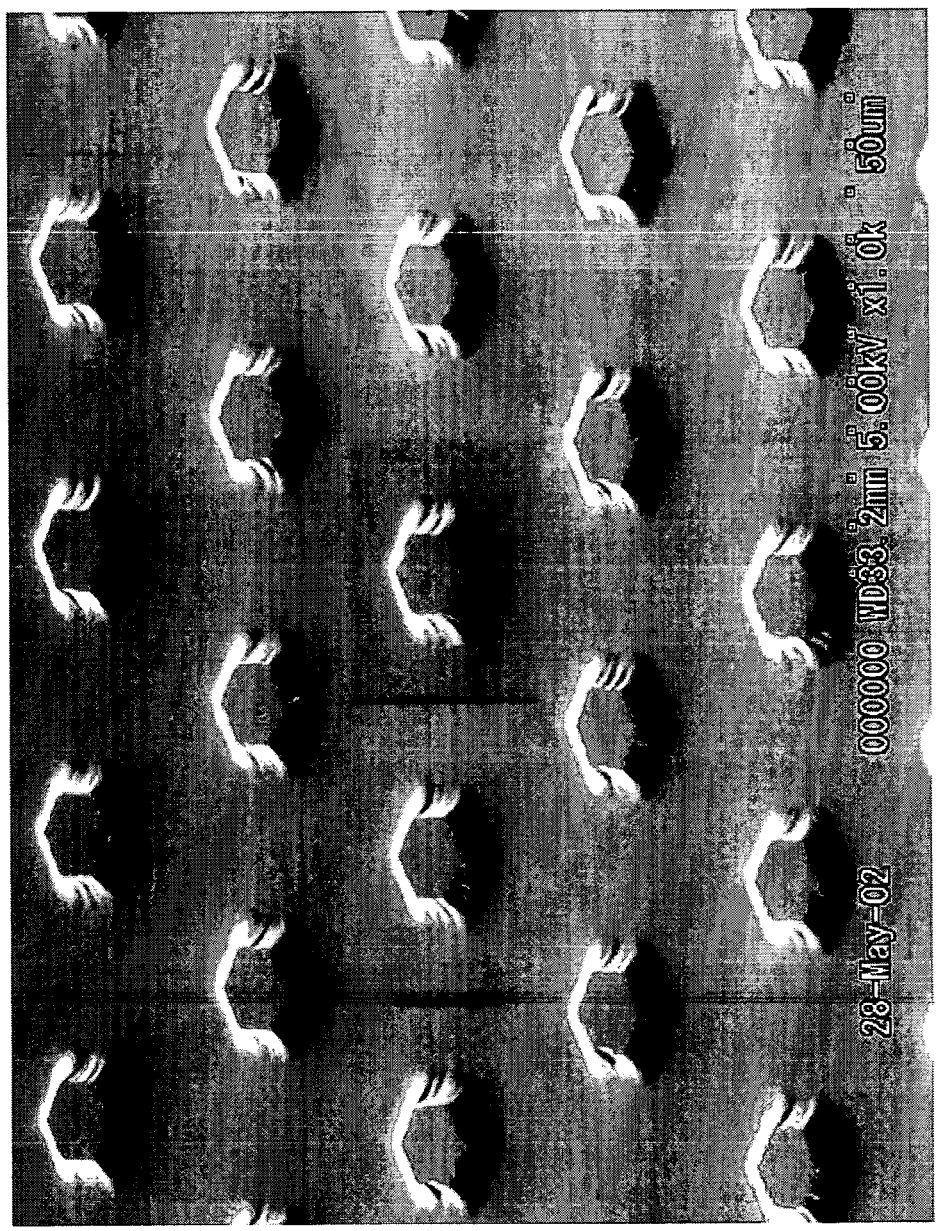
FIG. 24 illustrates the state of the surface of a GaN semi-finished substrate immediately after a light emitting structure is formed in accordance with the method of fabricating a GaN based light emitting diode according to the sixth embodiment of the present invention.
Figure 25:
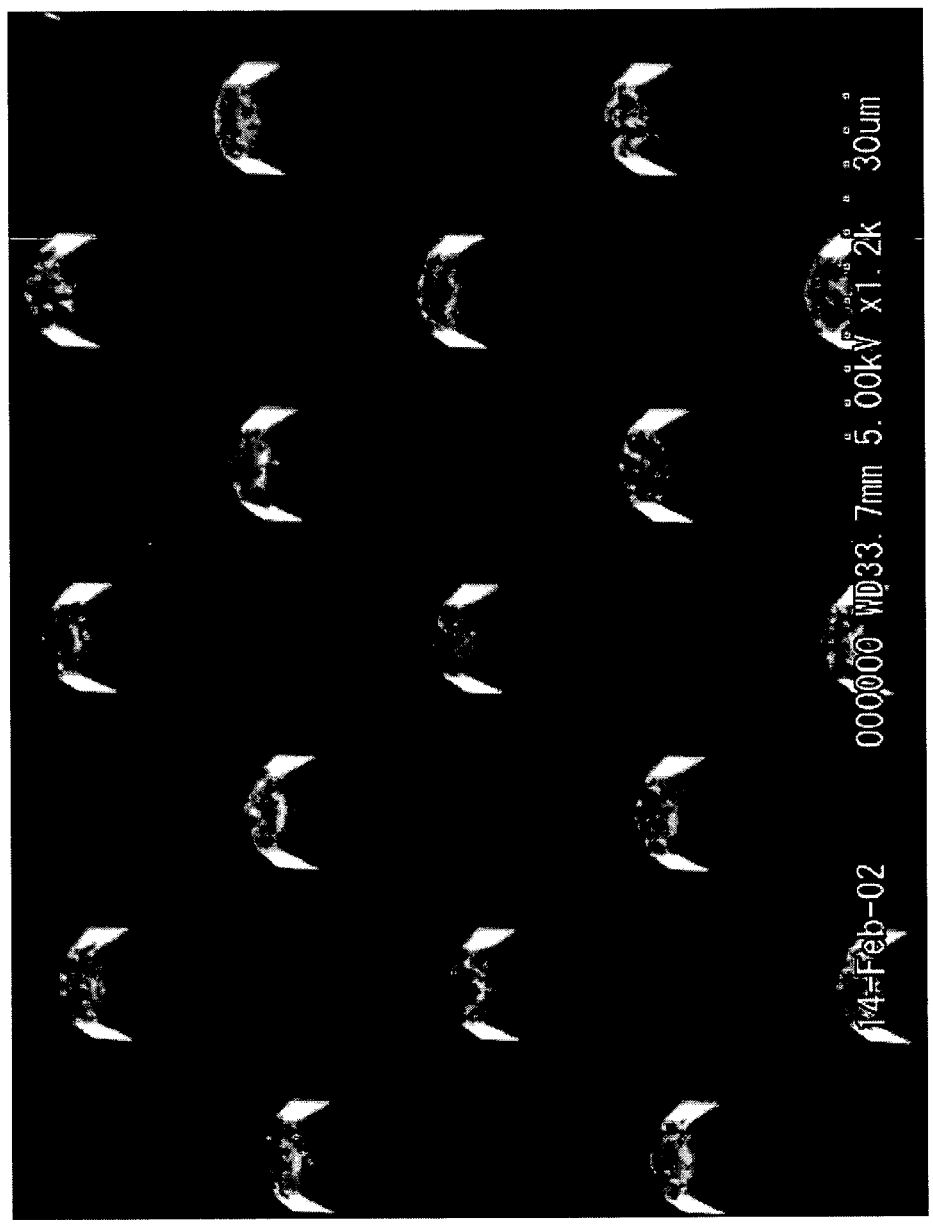
FIG. 25 illustrates the state of the surface of a GaN semi-finished substrate immediately after a light emitting structure is formed in accordance with a related art method of fabricating a GaN based light emitting diode.

The surface of the GaN semi-finished substrate immediately after the active layer 16 and the p-type GaN layer 17 are grown is observed by SEM (Scanning Electron Microscope). The resultant SEM photograph is shown in FIG. 24. For comparison, a SEM photograph of the surface of a GaN semi-finished substrate fabricated by a related art fabrication method is shown in FIG. 25. As is apparent from FIG. 24, in the case of growth after removal of the growth mask, pits are buried with the growing layer to improve the flatness, thereby significantly improving the crystallinity of the growth layer.

As a result of drive of the GaN based light emitting diode by applying a current between the p-side electrode 20 and the n-side electrode 19, light emission having an emission wavelength ranging from 380 to 620 nm depending on the In content of the active layer 16 was observed through the sapphire substrate 11.

According to the sixth embodiment, like the first embodiment, after the hexagonal truncated pyramid shaped n-type GaN layer 15 is selectively grown on the portion of the n-type GaN layer 12, which portion is exposed from each of the openings 13 formed in the growth mask 14 made from SiO$_2$ and then the growth mask 14 is removed by etching, the active layer 16 and the p-type GaN layer 17 are grown on the hexagonal truncated pyramid shaped n-type GaN layer 15. Accordingly, there is no problem associated with incorporation of Si released from the growth mask 14 into the growing layer at the time of growth of the p-type GaN layer 17. As a result, it is possible to form the p-type GaN layer 17 doped with a sufficient amount of Mg and thereby having a low resistivity, and hence to improve the luminous efficiency of the GaN based light emitting diode.

Since the crystallinity of each of the active layer 16 and the p-type GaN layer 17 grown on the upper plane composed of the C-plane of the hexagonal truncated pyramid shaped n-type GaN layer 15 is excellent and the p-side electrode 20 is formed on the upper plane composed of the C-plane of the p-type GaN layer 17 in such a manner as to be separated from the corners, it is possible to cause light emission only from the active layer 16 having high crystallinity, and hence to obtain a high luminous efficiency.

If the opening 18 is formed in the p-side GaN layer 17 and the active layer 16 by dry etching, for example, RIE in order to form the n-side electrode 19, or if the p-type GaN layer 17 and the active layer 16 are etched by dry etching, for example, RIE in order to separate the device from another device for fabricating an integrated type semiconductor light emitting unit, it is difficult to avoid occurrence of damage of the active layer 16. In this regard, according to this embodiment, since the portion at which damage may occur is sufficiently separated from a light emission region including the p-side electrode 20 and its neighborhood ranging from 2 to 5 µm, such damage does not exert any adverse effect on the light emission characteristics of the device.

The height between stepped portions of the hexagonal truncated pyramid shaped n-type GaN layer 15 can be made somewhat large so as to allow light emitted from the active layer 16 formed on the upper plane of the GaN layer 15 to be reflected downwardly from the side planes of the hexagonal truncated pyramid shape. This is effective to improve the light emergence efficiency and hence to enhance the luminous efficiency. Further, a metal film having a high reflectance, for example, a silver (Ag) film may be used as the p-side electrode 20 in place of the Ni/Pt/Au film. With this configuration, it is possible to improve the reflectance of the upper plane of the hexagonal truncated pyramid shaped p-type GaN layer 17. This is effective to improve the light emergence efficiency, and hence to enhance the luminous efficiency.

Figure 26:
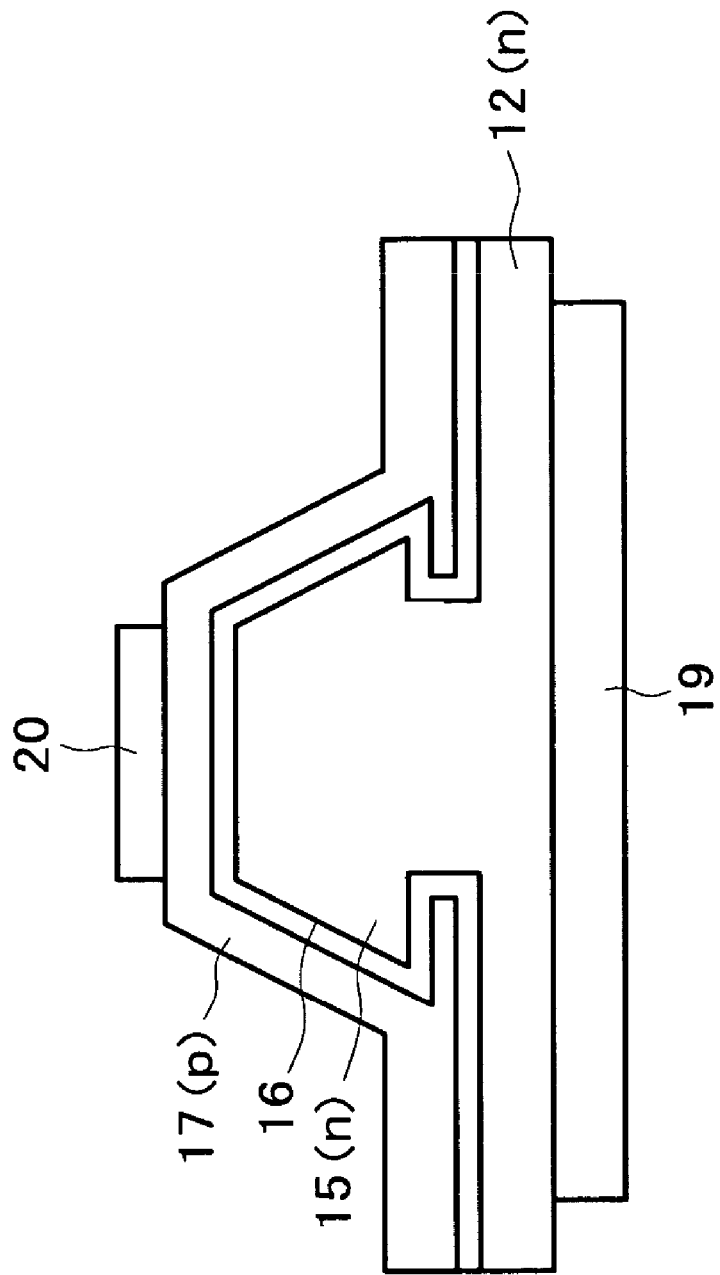
FIG. 26 is a sectional view showing a GaN based light emitting diode according to a seventh embodiment of the present invention.

A GaN based light emitting diode according to a seventh embodiment of the present invention will be described below with reference to FIG. 26.

The same steps as those in the sixth embodiment are repeated until a p-type GaN layer 17 is grown on a hexagonal truncated pyramid shaped structure, and a p-side electrode 20 is formed on the upper plane of the p-type GaN layer 17. The stacked layer structure, which includes the n-type GaN layer 12 and the hexagonal truncated pyramid shaped structure formed thereon, is peeled from the sapphire substrate 11 by irradiating the sapphire substrate 11 with laser beams such as excimer laser beams from the back surface side of the sapphire substrate 11. The back surface of the n-type GaN layer 12 of the stacked layer structure thus peeled is flattened by etching or the like, and as shown in FIG. 26, an n-side electrode 19 is formed on the back surface of the n-type GaN layer 12. The n-side electrode 19 may be configured as a transparent electrode made from ITO (Indium Tin Oxide). In this case, the n-side electrode 19 can be formed on the back surface of the n-type GaN layer 12 so as to extend in a wide range including a portion corresponding to the hexagonal truncated pyramid shaped structure. If the n-side electrode 19 is configured as a metal stacked film having a Ti/Pt/Au structure, in order to allow emission of light to external through the n-type GaN layer 12, an opening 19*a* is formed in a portion, corresponding to the hexagonal truncated pyramid structure, of the n-side electrode 19 as shown in FIG. 15.

According to the seventh embodiment, the same advantage as that of each of the third and sixth embodiments can be obtained.

An image display unit according to an eighth embodiment of the present invention will be described below.

According to this image display unit, the GaN based light emitting diode in the sixth embodiment is used in place of the GaN based light emitting diode in the image display unit according to the fourth embodiment. The other configurations are the same as those of the fourth embodiment.

According to the eighth embodiment, the same advantage as that of each of the fourth and sixth embodiments can be obtained.

An illuminating unit according to a ninth embodiment of the present invention will be described below.

According to this illuminating unit, the GaN based light emitting diode in the sixth embodiment is used in place of the GaN based light emitting diode in the illuminating unit according to the fifth embodiment. The other configurations are the same as those of the fifth embodiment.

According to the ninth embodiment, the same advantage as that of each of the fifth and sixth embodiments can be obtained.

While the preferred embodiments of the present invention have been described, the present invention is not limited thereto, and it is to be understood that various variations may be made on the basis of the technical thought of the present invention.

For example, the numeral values, materials, structures, shapes, substrate, raw materials, and processes used in the first to ninth embodiment are for illustrative purposes only, and therefore, variations and/or modifications from same are contemplated.

To be more specific, in the first to ninth embodiments, an AlGaN layer excellent in light confinement characteristic or an InGaN layer with a reduced In content may be provided in the vicinity of the active layer 16 in order to improve the characteristics of the active layer 16. Also, if needed, InGaN may be replaced with AlGaInN by adding Al to InGaN for obtaining an effect of shortening a band gap due to so-called bowing. Further, if needed, an optical guide may be provided between the active layer 16 and the n-type GaN layer 15 and/or between the active layer 16 and the p-type GaN layer 17.

The sapphire substrate, used in the first to ninth embodiments, may be replaced with another substrate such as, a SiC substrate, Si substrate or the like. Alternatively, a GaN substrate with a low dislocation density, which is obtained by a lateral crystal growth technique such as ELO (Epitaxial Lateral Overgrowth) or pendeo-epitaxial growth, may be used in place of the sapphire substrate.

In the first to ninth embodiments, the p-side electrode 20 may be made from Au or Ag and a contact metal layer having a thickness equal to or less than a penetration length of light emitted from the active layer 16 and made from Ni, Pd, Co, or Sb be formed between the p-type GaN layer 17 and the p-side electrode 20. With this configuration, it is possible to further improve the luminous efficiency of the GaN based light emitting diode by the reflectance intensifying effect of the contact metal layer.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A semiconductor light emitting device comprising:
   a semiconductor layer of a first conductive type formed on a principal plane of a substrate, the semiconductor layer including a raised crystal portion having tilt crystal planes tilted from the principal plane;
   at least an active layer and a semiconductor layer of a second conductive type wherein, the active layer and the semiconductor layer are sequentially stacked at least on the tilt crystal planes of the raised crystal portion, and
   a first electrode electrically connected to the semiconductor layer of the first conductive type; and
   a second electrode electrically connected to the semiconductor layer of the second conductive type wherein, the second electrode are provided on the semiconductor layer of the second conductive type on the raised crystal portion; and
   wherein a size of the second electrode is in a range of about 50% or less of a size of the raised crystal portion on which the active layer and the semiconductor layer of the second conductive type have been stacked.

2. The semiconductor light emitting device according to claim 1, wherein the raised crystal portion has a wurtzite type crystal structure.

3. The semiconductor light emitting device according to claim 1, wherein the raised crystal includes a nitride based III–V compound semiconductor.

4. The semiconductor light emitting device according to claim 1, wherein each of the semiconductor layer of the first conductive type, the active layer, and the semiconductor layer of the second conductive type includes a nitride based III–V compound semiconductor.

5. The semiconductor light emitting device according to claim 1, wherein the tilt crystal planes includes S-planes.

6. The semiconductor light emitting device according to claim 1, wherein the raised crystal portion is formed into a hexagonal pyramid shape having S-planes as the tilt crystal planes.

7. The semiconductor light emitting device according to claim 1, wherein the raised crystal portion is formed into a hexagonal truncated pyramid shape having S-planes as the tilt crystal planes and a C-plane as an upper plane.

8. An integral type light emitting unit including a stack of a plurality of light emitting devices, each of the light emitting devices comprising:
   a semiconductor layer of a first conductive type formed on a principal plane of a substrate, wherein the semiconductor layer includes a raised crystal portion having tilt crystal planes tilted from the principal plane;
   at least an active layer and a semiconductor layer of a second conductive type, wherein the active layer and the semiconductor layer are sequentially stacked at least on the tilt crystal planes of the raised crystal portion;
   a first electrode electrically connected to the semiconductor layer of the first conductive type; and
   a second electrode electrically connected to the semiconductor layer of the second conductive type, wherein the second electrode are provided on the semiconductor layer of the second conductive type on the raised crystal portion, and
   wherein a size of the second electrode is in a range of about 50% or less of a size of the raised crystal portion on which the active layer and the semiconductor layer of the second conductive type have been stacked.

9. An image display unit comprising:
   a semiconductor layer of a first conductive type formed on one principal plane of a substrate, wherein the semiconductor layer includes a raised crystal portion having tilt crystal planes tilted from the principal plane;
   at least an active layer and a semiconductor layer of a second conductive type, wherein the active layer and the semiconductor layer are sequentially stacked at least on the tilt crystal planes of the raised crystal portion;
   a first electrode electrically connected to the semiconductor layer of the first conductive type; and
   a second electrode electrically connected to the semiconductor layer of the second conductive type, wherein the second electrode being provided on the semiconductor layer of the second conductive type on the raised crystal portion, and
   wherein a size of the second electrode is in a range of about 50% or less of a size of the raised crystal portion on which the active layer and the semiconductor layer of the second conductive type have been stacked.

10. An illuminating unit comprising:
    a semiconductor layer of a first conductive type formed on a principal plane of a substrate, wherein the semiconductor layer includes a raised crystal portion having tilt crystal planes tilted from the principal plane;
    at least an active layer and a semiconductor layer of a second conductive type, wherein the active layer and the semiconductor layer same sequentially stacked at least on the tilt crystal planes of the raised crystal portion;
    a first electrode electrically connected to the semiconductor layer of the first conductive type; and
    a second electrode electrically connected to the semiconductor layer of the second conductive type, wherein the second electrode is provided on the semiconductor layer of the second conductive type on the raised crystal portion, and
    wherein a size of the second electrode is in a range of about 50% or less of a size of the raised crystal portion on which the active layer and the semiconductor layer of the second conductive type have been stacked.

* * * * *